(12) United States Patent
Lin et al.

(10) Patent No.: US 11,081,506 B2
(45) Date of Patent: Aug. 3, 2021

(54) DISPLAY COMPONENT AND DISPLAY DEVICE

(71) Applicant: Shanghai Tianma Micro-Electronics Co.,Ltd., Shanghai (CN)

(72) Inventors: Baiquan Lin, Shanghai (CN); Kerui Xi, Shanghai (CN); Junting Ouyang, Shanghai (CN); Qiongqin Mao, Shanghai (CN); Feng Qin, Shanghai (CN); Jine Liu, Shanghai (CN); Xiangjian Kong, Shanghai (CN); Xiaohe Li, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/532,953

(22) Filed: Aug. 6, 2019

(65) Prior Publication Data
US 2020/0365626 A1    Nov. 19, 2020

(30) Foreign Application Priority Data
May 14, 2019 (CN) .......................... 201910397934.6

(51) Int. Cl.
*G02F 1/133* (2006.01)
*H01L 27/12* (2006.01)
(Continued)

(52) U.S. Cl.
CPC ........ *H01L 27/1255* (2013.01); *G02F 1/1362* (2013.01); *G02F 1/1675* (2019.01);
(Continued)

(58) Field of Classification Search
CPC . H01L 23/5227; H01L 27/1255; H01L 28/10; H01L 2924/19042; H01L 27/124;
(Continued)

(56) References Cited

U.S. PATENT DOCUMENTS

2006/0164586 A1* 7/2006 Yamada .............. G02F 1/13452
349/149
2014/0266494 A1* 9/2014 Lan ..................... H01L 27/1259
333/32
(Continued)

FOREIGN PATENT DOCUMENTS

CN        102646866 A    8/2012
CN        102982740 B    11/2014
(Continued)

*Primary Examiner* — Eric A. Ward
(74) *Attorney, Agent, or Firm* — Anova Law Group, PLLC

(57) ABSTRACT

A display component and a display device are provided. The display component includes a display panel including a first substrate, a thin-film transistor array layer, a second substrate and a coil-containing film layer. The coil-containing film layer at least includes a first metal layer, a first insulation layer, a second metal layer, and a second insulation layer. The first metal layer includes at least one first coil and the second metal layer includes at least one signal line, where the one first coil of the first metal layer is electrically connected to one or two signal lines of the second metal layer. An orthographic projection of the first coil on the first substrate is at least partially in the display region. The display component further includes a coil drive circuit, where the coil drive circuit is electrically connected to each of the first coil and the signal line, respectively.

16 Claims, 16 Drawing Sheets

(51) Int. Cl.
*H05K 1/18* (2006.01)
*G02F 1/1675* (2019.01)
*G02F 1/1362* (2006.01)

(52) U.S. Cl.
CPC ............ *H01L 27/124* (2013.01); *H05K 1/189* (2013.01); *H05K 2201/10136* (2013.01)

(58) Field of Classification Search
CPC .................... H05K 1/189; H05K 2201/10136; G02F 1/13; G02F 1/13306; G02F 1/1362; G02F 1/136286; G02F 1/1368; G02F 1/167; G02F 1/1675; G02F 1/16755; G02F 1/1685
See application file for complete search history.

(56) References Cited

U.S. PATENT DOCUMENTS

| | | | |
|---|---|---|---|
| 2015/0022488 A1* | 1/2015 | Xi | G06F 3/047 345/174 |
| 2017/0045978 A1* | 2/2017 | Xu | G06F 3/0412 |
| 2017/0047361 A1* | 2/2017 | Xu | H01L 27/13 |
| 2020/0020751 A1* | 1/2020 | Cho | G02F 1/136286 |

FOREIGN PATENT DOCUMENTS

| | | |
|---|---|---|
| CN | 106098702 A | 11/2016 |
| CN | 106464030 A | 2/2017 |
| CN | 107731855 A | 2/2018 |

* cited by examiner

DISPLAY COMPONENT AND DISPLAY DEVICE

CROSS-REFERENCE TO RELATED APPLICATION

This application claims the priority of Chinese Patent Application No. 201910397934.6, filed on May 14, 2019, the content of which is incorporated herein by reference in its entirety.

TECHNICAL FIELD

The present disclosure generally relates to the field of display technology and, more particularly, relates to a display component and a display device.

BACKGROUND

The existing wireless transmission functions integrated in devices including mobile phones, point of sale (POS) machines, and the like are implemented by integrating electromagnetic coils in pre-manufactured machines, which are essentially based on the principle of electromagnetic induction. An alternating current is inputted to a transmitting coil, and the transmitting coil generates an alternating magnetic field. The varying magnetic field generates an alternating current in a receiving coil, thereby implementing the transmission of electric energy or signal from the transmitting coil to the receiving coil.

However, functions of modern electronic communication devices are becoming more powerful with the technology development. For example, mobile phones may integrate functions, such as calling, internet, global positioning system (GPS), Bluetooth, near-field communication (NFC), wireless charging, and the like, so multiple antennas with different bands need to be designed. For the existing antenna structure, after winding into an induction coil, wires including enameled wires, and the like may be encapsulated by an insulation film and then disposed in a mobile communication device; or wires including enameled wires, and the like may be directly wound into the induction coil inside the shell of the mobile communication device. The taps of the induction coil may be electrically connected to a circuit board in the mobile communication device, which may transmit signals received and transmitted by the antenna. Currently, the antenna is designed to be inside the shell of the mobile communication device, so it is difficult to develop the communication device in a light-weight, thin, integrated and low-cost manner.

Therefore, there is a need to provide a display component and a display device capable of integrating multiple functions of wireless transmission on a panel, which may be advantageous for reducing cost, improving integration, and further developing the communication device in a light-weight, thin and integrated manner.

SUMMARY

One aspect of the present disclosure provides a display component. The display component includes a display panel including a first substrate, a thin-film transistor array layer, a second substrate and a coil-containing film layer. The coil-containing film layer is on a side of the first substrate, the thin-film transistor array layer is on a side of the coil-containing film layer away from the first substrate, and the second substrate is on a side of the thin-film transistor array layer away from the first substrate. The coil-containing film layer at least includes a first metal layer, a first insulation layer, a second metal layer, and a second insulation layer, where the first metal layer is on the side of the first substrate adjacent to the second substrate, the first insulation layer is on a side of the first metal layer away from the first substrate, the second metal layer is on a side of the first insulation layer away from the first substrate, and the second insulation layer is on a side of the second metal layer away from the first substrate. The first metal layer includes at least one first coil and the second metal layer includes at least one signal line, where the one first coil of the first metal layer is electrically connected to one or two signal lines of the second metal layer. The display panel includes a display region and a non-display region surrounding the display region, and an orthographic projection of the first coil on the first substrate is at least partially in the display region. The display component further includes a coil drive circuit, where the coil drive circuit is electrically connected to each of the first coil and the signal line, respectively.

Another aspect of the present disclosure provides a display device. The display device includes the display component. The display component includes a display panel including a first substrate, a thin-film transistor array layer, a second substrate and a coil-containing film layer. The coil-containing film layer is on a side of the first substrate, the thin-film transistor array layer is on a side of the coil-containing film layer away from the first substrate, and the second substrate is on a side of the thin-film transistor array layer away from the first substrate. The coil-containing film layer at least includes a first metal layer, a first insulation layer, a second metal layer, and a second insulation layer, where the first metal layer is on the side of the first substrate adjacent to the second substrate, the first insulation layer is on a side of the first metal layer away from the first substrate, the second metal layer is on a side of the first insulation layer away from the first substrate, and the second insulation layer is on a side of the second metal layer away from the first substrate. The first metal layer includes at least one first coil and the second metal layer includes at least one signal line, where the one first coil of the first metal layer is electrically connected to one or two signal lines of the second metal layer. The display panel includes a display region and a non-display region surrounding the display region, and an orthographic projection of the first coil on the first substrate is at least partially in the display region. The display component further includes a coil drive circuit, where the coil drive circuit is electrically connected to each of the first coil and the signal line, respectively.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
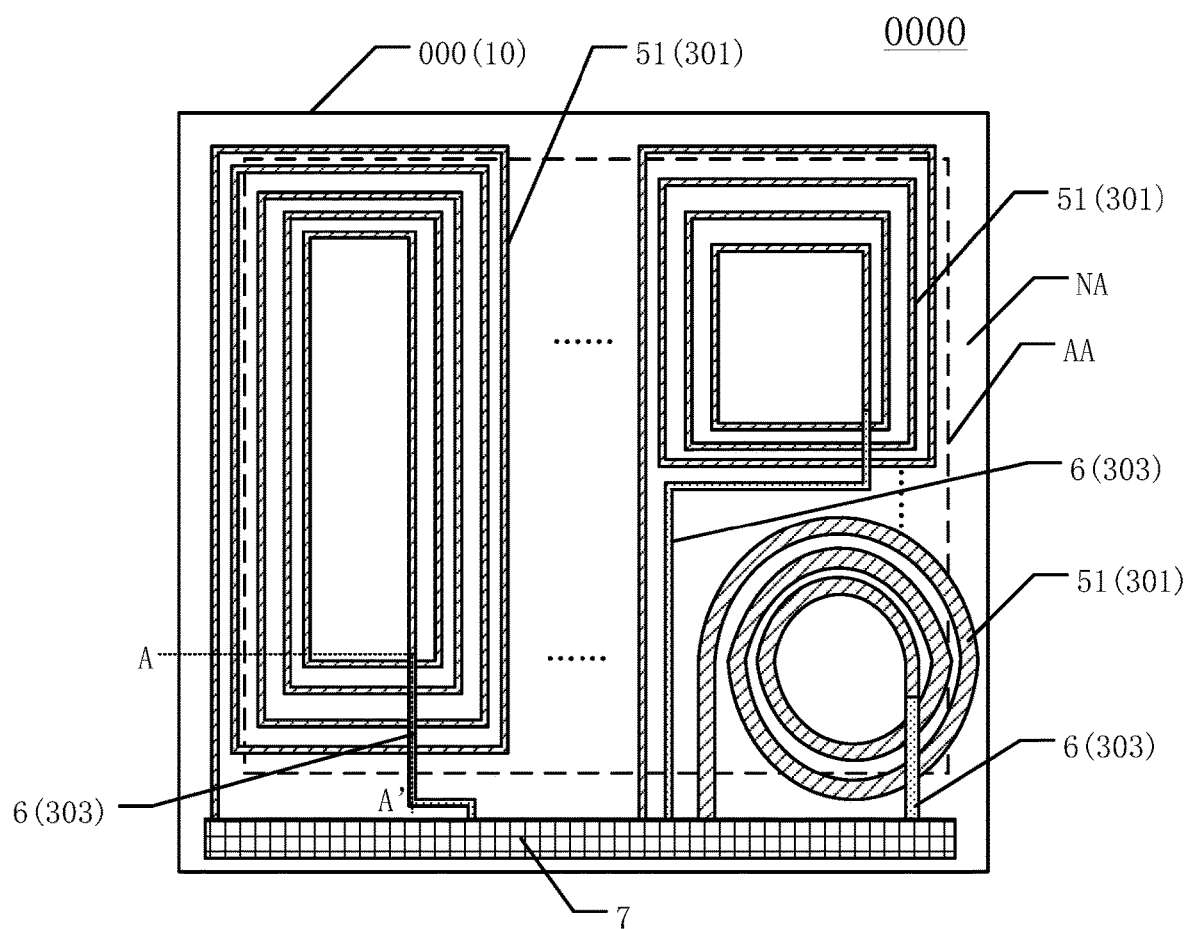
FIG. 1 illustrates a top-view schematic of an exemplary display component according to embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

Figure 2:
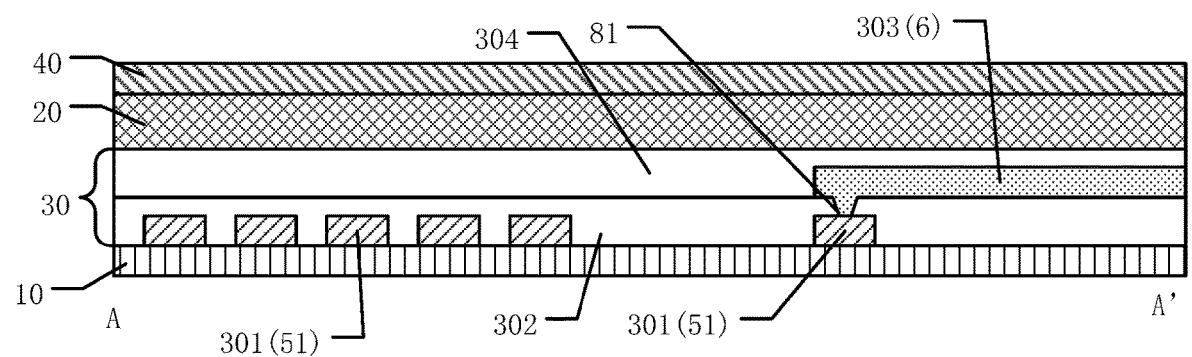
FIG. 2 illustrates a cross-sectional structural schematic along a A-A' direction in FIG. 1.

Referring to FIG. 1 and FIG. 2, FIG. 1 illustrates a top-view schematic of an exemplary display component according to embodiments of the present disclosure (in order to illustrate a structure of the coil-containing film layer 30 in one embodiment, the top-view schematic of FIG. 1 may only illustrate the structure of coil-containing film layer, any other structures may be included in the present disclosure). FIG. 2 illustrates a cross-sectional structural schematic along a A-A' direction in FIG. 1. A display component 0000 provided in one embodiment may include a display panel 000. The display panel 000 may include a first substrate 10, a thin-film transistor array layer 20, a second substrate 40 and a coil-containing film layer 30. Optionally, the second substrate 40 may be a color film substrate in a liquid crystal display panel, a package substrate or a protective cover in an organic light-emitting display panel, or an opposite substrate in an electrophoretic display device, which may not be limited according to various embodiments of the present disclosure. Optionally, the thin-film transistor array layer 20 may include a gate electrode layer, an active layer, a source/drain metal layer (not shown), etc. The coil-containing film layer 30 may be on a side of the first substrate 10. The thin-film transistor array layer 20 may be on a side of the coil-containing film layer 30 away from the first substrate 10. The second substrate 40 may be on a side of the thin-film transistor array layer 20 away from the first substrate 10.

The coil-containing film layer 30 may at least include a first metal layer 301, a first insulation layer 302, a second metal layer 302 and a second insulation layer 304. The first metal layer 301 may be on the side of the first substrate 10 adjacent to the second substrate 40. The first insulation layer 302 may be on a side of the first metal layer 301 away from the first substrate 10. The second metal layer 303 may be on a side of the first insulation layer 302 away from the first substrate 10. The second insulation layer 304 may be on a side of the second metal layer 303 away from the first substrate.

The first metal layer 301 may include at least one first coil 51, and the second metal layer 303 may include at least one signal line 6. The one first coil 51 of the first metal layer 301 may be electrically connected to one or two signal lines 6 of the second metal layer 303. Optionally, the one first coil 51 of the first metal layer 301 may be electrically connected to one or two signal lines 6 of the second metal layer 303 through a first via 81.

The display panel 000 may include a display region AA and a non-display region NA surrounding the display region AA. The orthographic projection of the first coil 51 on the first substrate 10 may be at least partially in the display region AA. That is, the orthographic projection of the first coil 51 on the first substrate 10 may be partially in the display region AA, and the other portion of the orthographic projection of the first coil 51 on the first substrate 10 may be in the non-display region.

The display component 0000 may further include a coil drive circuit 7 which may be electrically connected to the first coil 51 and the signal line 6, respectively.

For example, the display component 0000 may be provided in one embodiment. The coil-containing film layer 30 may be disposed in the display panel 000. The display panel 000 may include the first substrate 10, the thin-film transistor array layer 20, the second substrate 20 and the coil-containing film layer 30. The coil-containing film layer 30 may on the side of the first substrate 10. The thin-film transistor array layer 20 may be on the side of the coil-containing film layer 30 away from the first substrate 10. The second substrate 40 may be on the side of the thin-film transistor array layer 20 away from the first substrate 10, so the coil-containing film layer 30 used for fabricating the wireless transmission function may be integrated between the thin-film transistor array layer 20 and the first substrate 10, thereby implementing the integration of the display function and the wireless transmission function.

Figure 3:
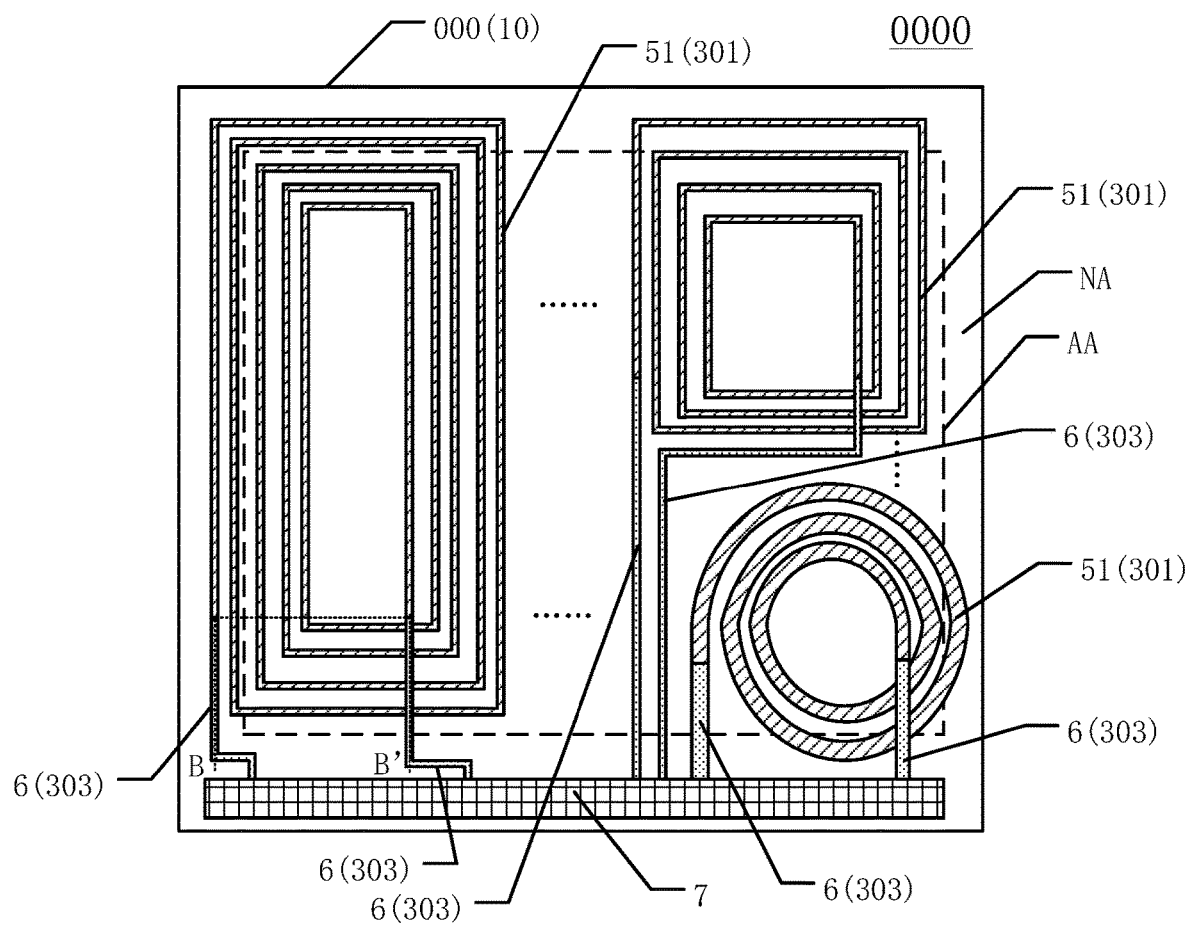
FIG. 3 illustrates a top-view schematic of another exemplary display component according to embodiments of the present disclosure.
Figure 4:
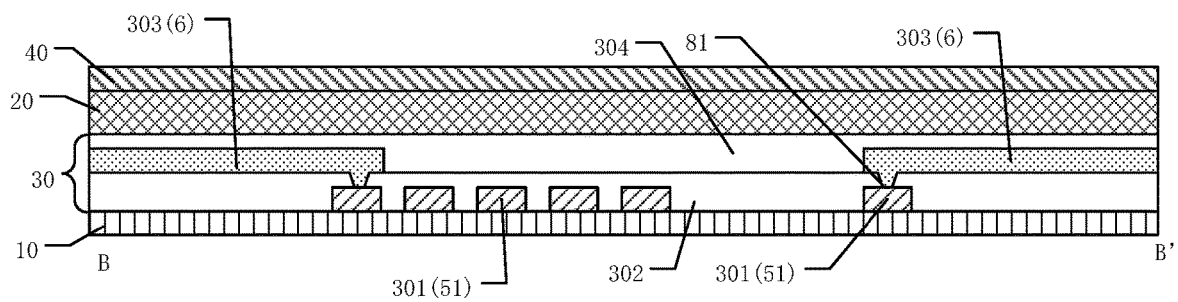
FIG. 4 illustrates a cross-sectional structural schematic along a B-B' direction in FIG. 3.

The coil-containing film layer 30 may at least include the first metal layer 301, the first insulation layer 302, the second metal layer 303 and the second insulation layer 304. The first metal layer 301 may be on the side of the first substrate 10 adjacent to the second substrate 40. The first insulation layer 302 may be on the side of the first metal layer 301 away from the first substrate 10. The second metal layer 303 may be on the side of the first insulation layer 302 away from the first substrate 10. The second insulation layer 304 may be on the side of the second metal layer 303 away from the first substrate 10. The first insulation layer 302 may be used to insulate the first metal layer 301 and the second metal layer 303, and the second insulation layer 304 may be used to insulate the second metal layer 303 and other film layers, which may avoid signal interference between the metal film layers. Moreover, in one embodiment, the first metal layer 301 may include at least one first coil 51, and the second metal layer 303 may include at least one signal line 6, so the signal input and output function may be implemented between the first coil 51 fabricated in the first metal layer 301 and the coil drive circuit 7 through the signal line 6 of the second metal layer 303. The two metal layers including the first metal layer 301 and the second metal layer 303 may be disposed, so the signal line 6 of the second metal layer 303 may be cross-line connected to the coil drive circuit 7 over the first coil 51 of the first metal layer 301 to transmit drive signals, where the one first coil 51 and the one signal line 6 may be electrically connected. The one first coil 51 of the first metal layer 301 may be electrically connected to one or two signal lines 6 of the second metal layer 303. Therefore, when the one first coil 51 of the first metal layer 301 is connected to the one signal line 6 of the second metal layer 303, the coil drive circuit 7 may be respectively connected to one end of the first coil 51 and one terminal of the signal line 6, which may be used as a signal input terminal and a signal output terminal. However the other end of the first coil 51 may be cross-line connected to the other terminal of the signal line 6 electrically (as shown in FIG. 1 and FIG. 2, the wires of different patterns are used in FIG. 1 to distinguish the winding of the first coil 51 at the first metal layer 301 and a plurality of the signal lines 6 at the second metal layer 303). When the one first coil 51 of the first metal layer 301 is connected to the two signal lines 6 of the second metal layer 303, the coil drive circuit 7 may be respectively connected to one terminal of the one signal line 6 and one terminal of another signal line 6, which may be used as the signal input terminal and the signal output terminal. However the other terminal of the one signal line 6 and the other terminal of another signal line 6 may be electrically cross-line connected to two ends of the first coil 51, respectively (as shown in FIG. 3 and FIG. 4, FIG. 3 illustrates a top-view schematic of another exemplary display component according to embodiments of the present disclosure; FIG. 4 illustrates a cross-sectional structural schematic along a B-B' direction in FIG. 3; the wires of different patterns are used in FIG. 3 to distinguish the winding of the first coil 51 located at the first metal layer 301 and the plurality of the signal lines 6 located at the second metal layer 303). The first coils 51 disposed in the first metal layer 301 may have a relatively large number of windings, so the two signal lines 6 connected to both the signal input terminal and the signal output terminal may be disposed in the second metal layer 303, which may be advantageous to save the space of the metal layer 301 to dispose a larger number of the first coils 51. In such way, the first coils 51 with more different working frequencies may be designed to implement the wireless transmission with more different functions.

In one embodiment, it may further define that the orthographic projection of the first coil 51 on the first substrate 10 may be at least partially in the range of the display region AA. In order to implement a narrow-framed design, an area of the display region AA may be much larger than an area of the non-display region NA in the display panel 000, but, in order to not affect the display quality of the display panel 000, the first coils 51 may be fabricated within the range of the non-display region in the existing technology, thereby resulting in a smaller range for being used for fabricating the coils, which may be disadvantageous to integrate a plurality of functions of the wireless transmission on the display panel. However, in one embodiment, the orthographic projection of the first coil 51 on the first substrate 10 may be at least partially in the range of the display region AA. The display region AA may have a large range, so more than one first coil 51, that is the plurality of the first coils 51, may be disposed. Referring to FIG. 1 and FIG. 3, based on required circuit parameters, each of the first coils 51 may be respectively designed to have different coil widths, coil spacings, coil lengths, inner and outer coil diameters, coil shapes, numbers of winding turns, etc., thereby obtaining corresponding required coil inductance, capacitance, and resistance. The two ends of each first coil 51 may be led out to the coil drive circuit 7 through the signal lines 6. When the first coil 51 is used as a transmitting antenna, the coil drive circuit 7 may supply a high-frequency current to the first coil 51. When the first coil 51 is used as a receiving antenna, the coil drive circuit 7 may receive and process the induced current generated by the varying magnetic field in the first coil 51. Different wireless transmission functions may respectively correspond to independent operating frequencies. For example, NFC (also known as short-range wireless communication) is a short-range high-frequency wireless communication technology that may allow non-contact point-to-point data transmission and data exchange between electronic devices. NFC is a short-range high-frequency radio technology and the corresponding NFC operating frequency is 13.56 MHz, that is, the NFC's working distance at 13.56 MHz is up to 20 cm. The corresponding operating frequency of wireless power consortium (WFC) wireless charging is 150 kHz. The corresponding operating frequency of alliance for wireless power (A4WP) wireless charging is 6.78 MHz. The corresponding operating frequency of Bluetooth is 2.4 GHz. When the operating frequency is the same as the circuit natural frequency, resonance may occur, and the energy and signal conversion efficiency may be the highest. The circuit natural frequency may depend on the electrical parameters of the circuit, such as inductance, resistance and capacitance of the circuit. Therefore, for different wireless transmission functions, different inductances, resistances and capacitances may need to be designed accordingly. For example, the NFC coil inductance may be about 1 µH to about 201, and the wireless charging coil inductance may be about 5 µH to 25 µH. It should be noted that the above-mentioned examples of frequency and inductance are from actual values of current products which may be only exemplary, but future products may not be limited to the value ranges. Therefore, the orthographic projection of the first coil 51 on the first substrate 10 may be defined to be at least partially located in the display region AA, thereby fabricating more first coils of different operating frequencies in the display component 0000 in one embodiment, and further implementing the integration of multiple functions of the wireless transmission on the panel.

In one embodiment, the coil-containing film layer 30 implementing the wireless transmission function may be integrated between the thin-film transistor array layer 20 and the first substrate 10 in the display panel 000, thereby integrating the display function and the wireless transmission function. Furthermore, the orthographic projection of the first coil 51 on the first substrate 10 may be defined to be at least partially located in the display region AA, thereby integrating multiple functions of the wireless transmission on the panel, which may be advantageous to reduce cost and improve integration, and may further develop the devices to be light-weight and integrated.

It should be noted that, in one embodiment, the film layer required for forming the first coils 51 may be formed on the first substrate 10 by a physical vapor deposition (PVD) process or an electroplating process. The physical vapor deposition process may refer to the process of transferring substances by physical processes and transferring atoms or molecules from a source to a substrate surface. The physical vapor deposition process may spray small-sized particles with special properties, such as high strength, high wear resistance, high heat dissipation, anticorrosion, etc., on the low performance substrate, which may make the substrate to have better performance. The basic methods are a vacuum evaporation process, a sputtering process, and an ion plating process. In one embodiment, the electroplating process may be recommended. Compared with the PVD process, the electroplating process may quickly fabricate the first metal layer 301 and the second metal layer 303 having a larger thickness to obtain lower resistance coil wires. For the same material and resistance, a thicker plating layer may fabricate narrower coil wires, which may further save space, and be advantageous to fabricate the first coils with more numbers of winding turns, quantities and types.

It should be further noted that, in one embodiment, the number of the first coils 51, the number of winding turns and the shape of the wires in FIG. 1 may be merely illustrative, which may not be limited according to various embodiments of the present disclosure, and may be designed in the implementation according to functional requirements, panel sizes, etc.

In some optional embodiments, referring to FIGS. 1-4, the first metal layer 301 may include the plurality of the first coils 51 which may have different winding lengths. The second metal layer 303 may include the plurality of the signal lines 6. The number of the first coils 51 may be the same as the number of the signal lines 6 (shown in FIG. 1). Or, the number of the signal lines 6 may be twice the number of the first coils 51 (shown in FIG. 3).

In one embodiment, it may further illustrate that the plurality of the first coils 51 may be disposed at the first metal layer 301 and the winding length of each first coil 51 may be different, so the plurality of the first coils 51 may be configured to a plurality of different operating frequencies, thereby implementing the integration of multiple functions of the wireless transmission on the panel. In one embodiment, it may further illustrate that the number of the first coils 51 may be the same as the number of the signal lines 6 when one first coil 51 of the first metal layer 301 is electrically connected to one signal line 6 of the second metal layer 303, (that is, the coil drive circuit 7 is respectively connected to each of one end of the first coil 51 and one terminal of the signal line 6, which are used as the signal input terminal and the signal output terminal) and the other end of the first coil 51 is electrically connected to the other terminal of the signal line 6. The number of the signal lines 6 may be set to be twice the number of the first coils 51 (that is, one first coil 51 may be electrically connected two signal lines 6 respectively) when one first coil 51 of the first metal layer 301 may be electrically connected to two signal lines 6 of the second metal layer 301 correspondingly (that is, the coil drive circuit 7 may be respectively connected to one terminal of one signal line 6 and one terminal of another signal line 6, which are used as the signal input terminal and the signal output terminal) and both terminals of the first coil 51 may be electrically connected to the other terminal of the one signal line 6 and the other terminal of another signal line 6. In such way, more available space of the metal layer 301 may be used to dispose more first coils 51, and more first coils 51 with different working frequencies may be designed to implement the wireless transmission with more different functions.

Figure 5:
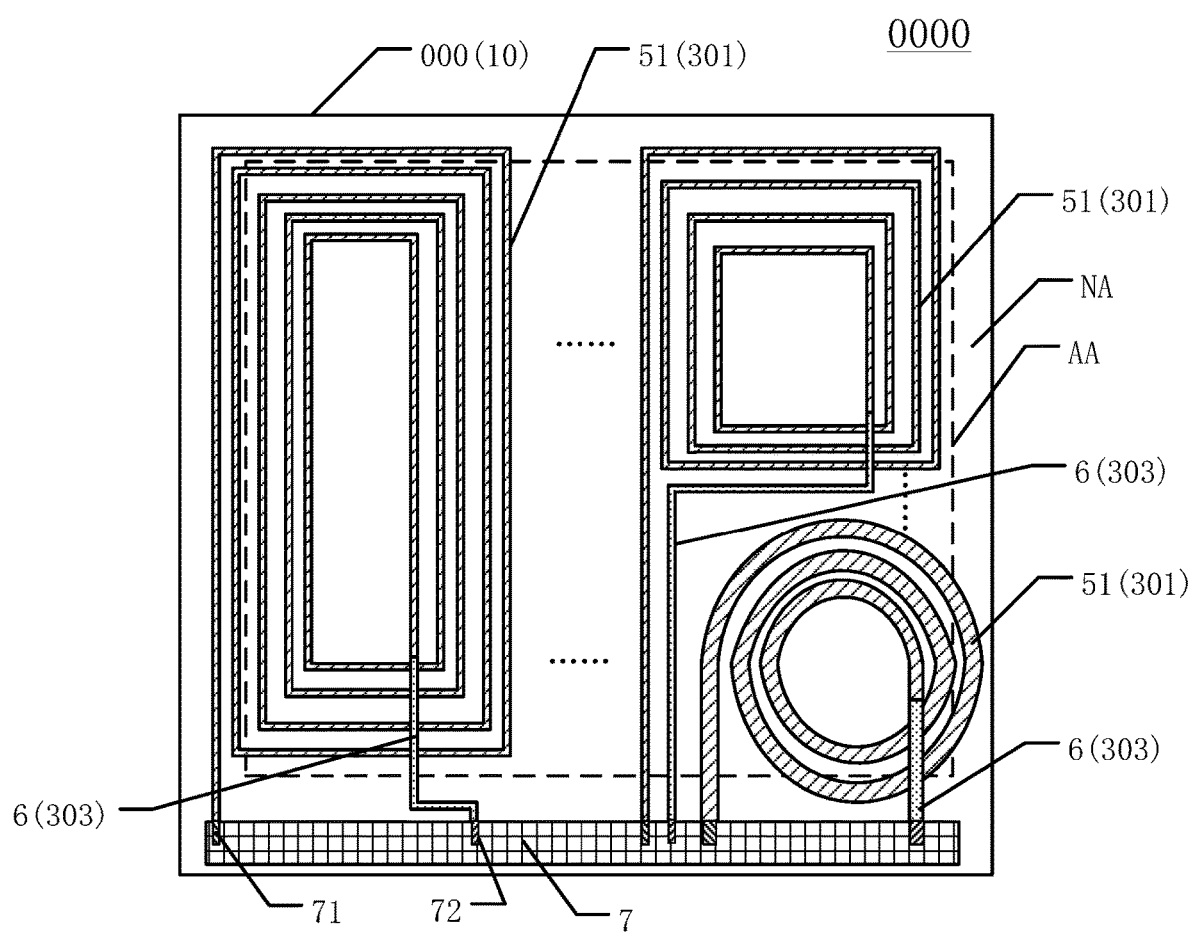
FIG. 5 illustrates a top-view schematic of another exemplary display component according to embodiments of the present disclosure.

In some embodiments, referring to FIG. 5, FIG. 5 illustrates a top-view schematic of another exemplary display component according to embodiments of the present disclosure. In one embodiment, the coil drive circuit 7 may at least include one signal transmitting terminal 71 and one signal receiving terminal 72. The signal transmitting terminal 71 may be electrically connected to one first coil 51 of the first metal layer 301, and the signal receiving terminal 72 may be electrically connected to one signal line 6 of the second metal layer 303.

In one embodiment, it may further illustrate that the coil drive circuit 7 may at least include one signal transmitting terminal 71 and one signal receiving terminal 72. When the first coil 51 is used as a transmitting antenna, the signal transmitting terminal of the coil drive circuit 7 may supply a high frequency current to the first coil 51; when the first coil 51 is used as a receiving antenna, the signal receiving terminal 72 of the coil drive circuit 7 may receive and process the induced current generated by the varying magnetic field in the first coil 51, thereby implementing the wireless transmission function of the coil-containing film layer 30.

It should be noted that, in one embodiment, the corresponding electrical connection between the one first coil 51 of the first metal layer 301 and the one signal line 6 of the second metal layer 303 may be merely exemplary for description. When the one first coil 51 of the first metal layer 301 is electrically connected to two signal lines 6 of the second metal layer 303, the signal transmitting terminal 71 and the signal receiving terminal 72 of the coil drive circuit 7 may be respectively connected to each terminal of the two signal lines 6 of one same first coil 51, thereby supplying the input signal and output signal to the first coil 51 by the coil drive circuit 7.

Figure 6:
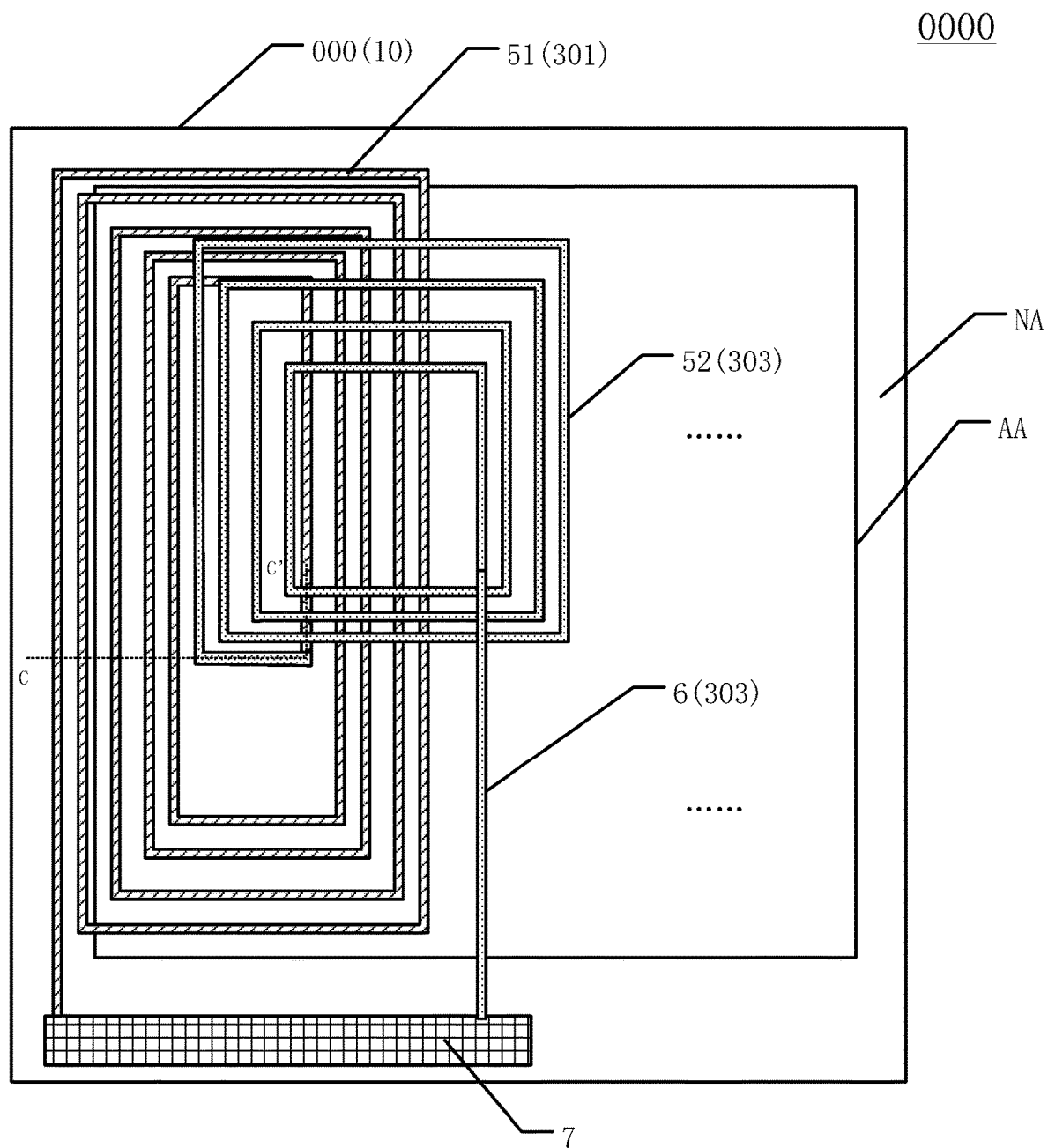
FIG. 6 illustrates a top-view schematic of another exemplary display component according to embodiments of the present disclosure.
Figure 7:
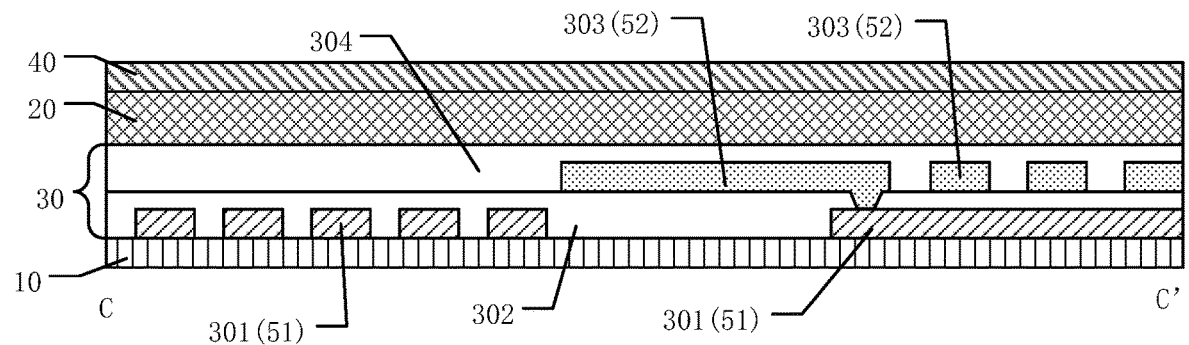
FIG. 7 illustrates a cross-sectional structural schematic along a C-C' direction in FIG. 6.

In other optional embodiments, referring to FIG. 6 and FIG. 7, FIG. 6 illustrates a top-view schematic of another exemplary display component according to embodiments of the present disclosure (in order to illustrate the technical solution in one embodiment, one first coil 51 and one second coil 52 may be merely exemplary in FIG. 6 for description). FIG. 7 illustrates a cross-sectional structural schematic along a C-C' direction in FIG. 6. In one embodiment, the second metal layer 303 may also include at least one second coil 52. One end of the second coil 52 may be electrically connected to the first coil 51, and the other end of the second coil 52 may be electrically connected to the signal line 6. The orthographic projection of the second coil 52 on the first substrate 10 may be at least partially in the display region AA.

In one embodiment, it may further illustrate that the second metal layer 303 may include at least one second coil 52. One end of the second coil 52 may be electrically connected to the first coil 51, that is, one first coil 51 of the first metal layer 301 may be wound to the second metal layer 303 and then continue to wind to form the second coil 52. Then the second coil 52 may be electrically connected to the signal line 6, which may be suitable for relatively large required inductance. Each coil may be designed to have different coil widths, coil spacings, coil lengths, inner and outer coil diameters, coil shapes, numbers of winding turns, etc., thereby obtaining corresponding required coil inductance, capacitance, and resistance. Therefore, the first coil 51 and the second coil 52 may be connected to form a coil having a longer coil length, which may allow the coil to obtain a relatively large inductance. The orthographic projection of the second coil 52 on the first substrate 10 may be at least partially in the range of the display area AA, so the space for disposing the second coil 52 may be increased correspondingly, which may be convenient to implement that one first coil 51 may correspond to one second coil 52 when a plurality of coils having relatively large inductance are required.

It should be noted that the first insulation layer 302 is disposed between the first metal layer 301 and the second metal layer 302, so the first coil 51 may overlap or partially overlap the second coil 52 in a direction perpendicular to the first substrate 10. In such way, it is convenient to dispose the second coil 52, and the winding of the second coil 52 may not need to avoid the first coil 51, which may be advantageous for manufacturing and also for further increasing the coil length.

Figure 8:
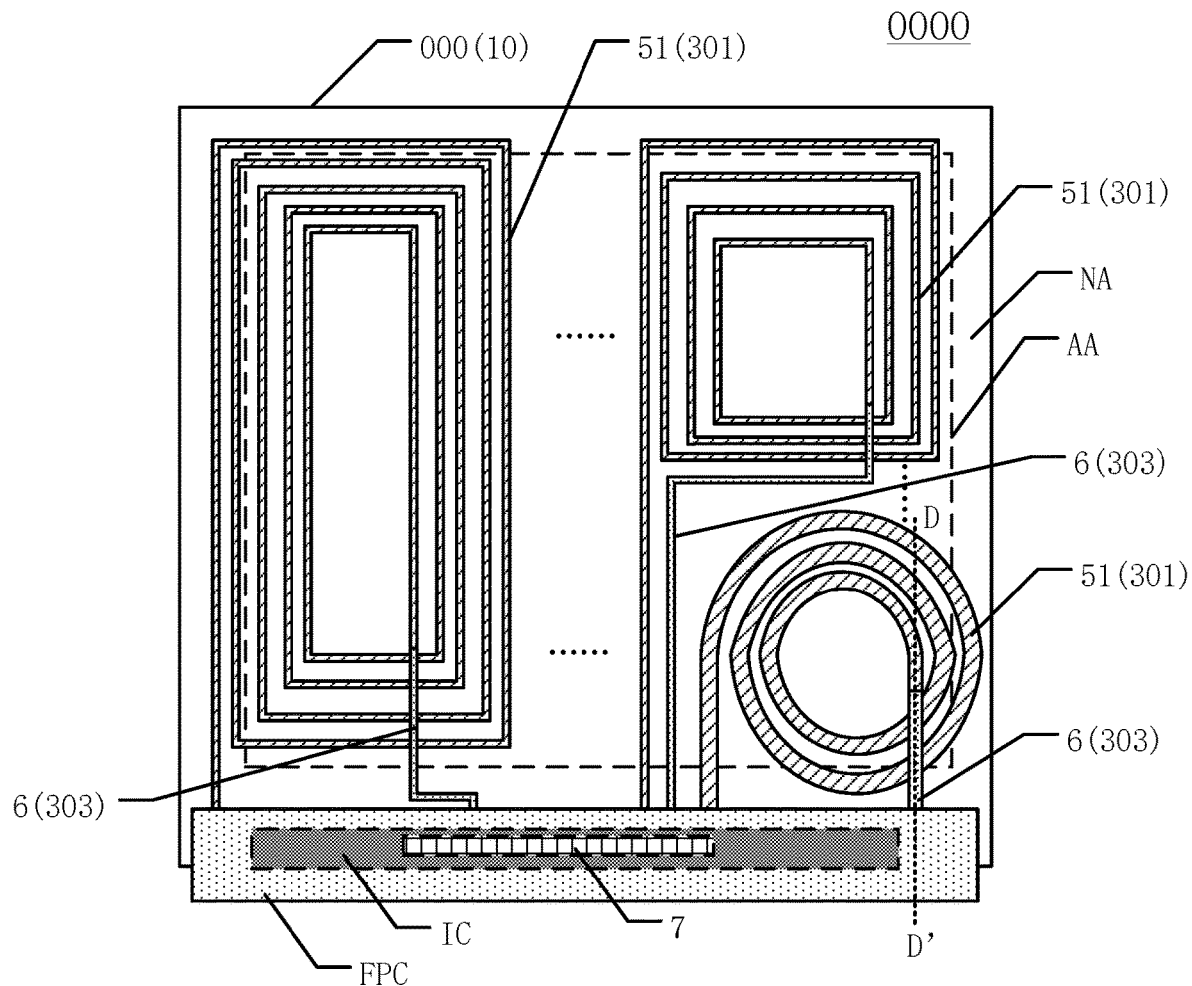
FIG. 8 illustrates a top-view schematic of another exemplary display component according to embodiments of the present disclosure.

In some optional embodiments, referring to FIG. 8, FIG. 8 illustrates a top-view schematic of another exemplary display component according to embodiments of the present disclosure. In one embodiment, the display component 0000 may further include a coil drive integrated circuit (IC). The coil drive circuit 7 may be integrated on the coil drive IC. The coil drive IC may be electrically connected to the first coil 51 and the signal line 6 through a coil drive flexible printed circuit (FPC), respectively.

In one embodiment, it may further illustrate the disposition of the coil drive circuit 7. The coil drive circuit 7 may be integrated on the coil IC and may be electrically connected to the first coil 51 and the signal line 6 through a coil drive FPC respectively, which may be advantageous for the narrow-framed design of the display panel 000. It should be noted that the coil IC may also be directly disposed on the display panel 000 without through the coil drive FPC. The disposition method may be selected according to actual requirements during implementation.

Figure 9:
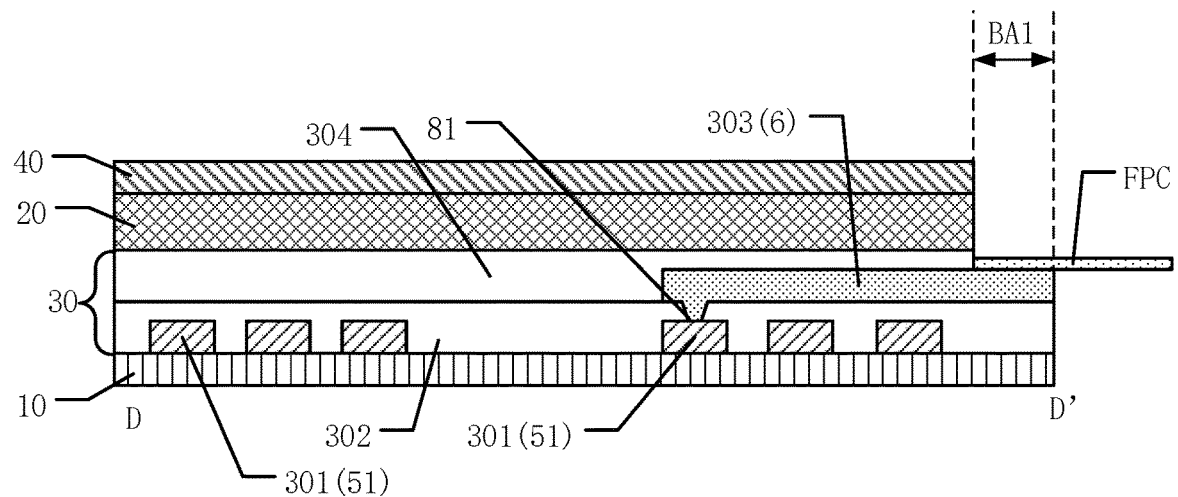
FIG. 9 illustrates a cross-sectional structural schematic along a D-D' direction in FIG. 8.

In some optional embodiments, referring to FIG. 9, FIG. 9 illustrates a cross-sectional structural schematic along a D-D' direction in FIG. 8. In one embodiment, the display panel 000 may include a first bonding area BA1. The thin-film transistor array layer 20 at the first bonding area BA1 may be hollowed out. The coil drive FPC and the signal line 6 may be attached and electrically connected to each other at the first bonding area BA1.

In one embodiment, it may further illustrate a binding structure of the coil drive PFC on the display panel 000. That is, the display panel 000 may include the first bonding area BA1. The thin-film transistor array layer 20 at the first bonding area BA1 may be hollowed out. The coil drive FPC and the signal line 6 may be attached and electrically connected to each other at the first bonding area BA1. The coil drive FPC may be directly press-connected onto the second metal layer 303 at the hollow position of the thin-film transistor array layer 20, thereby implementing the electrical connection between the coil drive FPC and the signal line 6. The display panel 000 itself may have the drive chip or the FPC in the bonding area used for binding the display drive, so the thin-film transistor array layer 20 at the first bonding area BA1 may be designed to be hollowed out and may be press-connected onto the coil drive FPC. In such way, the electrical connection between the coil drive FPC and the signal line 6 of the second metal layer 303 may be implemented, and also the display effect in the display region AA may not be affected.

Figure 10:
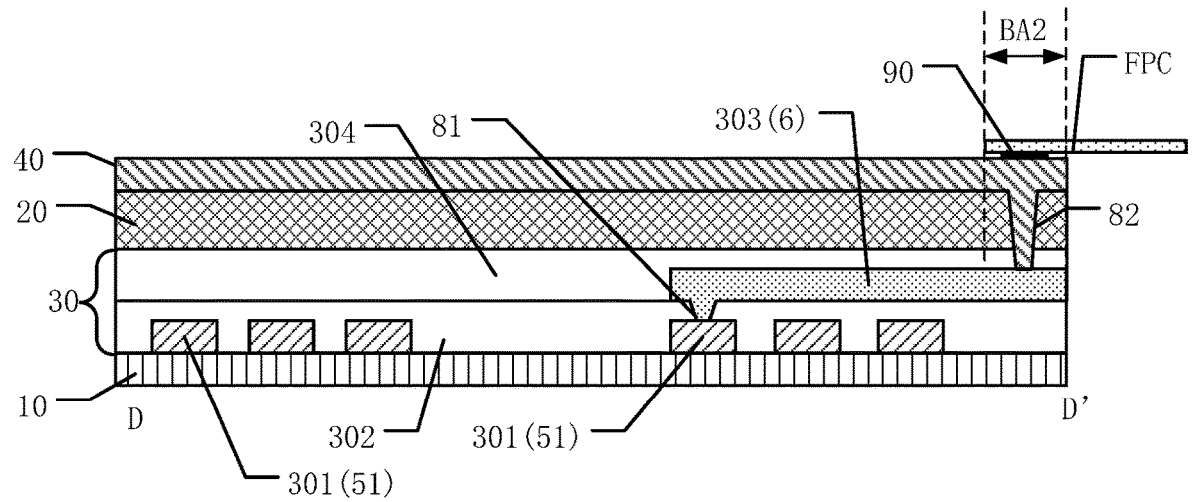
FIG. 10 illustrates another cross-sectional structural schematic along a D-D' direction in FIG. 8.

In some optional embodiments, referring to FIG. 10, FIG. 10 illustrates another cross-sectional structural schematic along a D-D' direction in FIG. 8. In one embodiment, the display panel 000 may include a second bonding area BA2. The second bonding area BA2 may include a plurality of conductive pads 90. The coil drive FPC and the conductive pads 90 may be attached and electrically connected to each other. The conductive pads 90 may be electrically connected to the signal line 6 through a second via 82 in the display panel 000.

In one embodiment, it may further illustrate another optional binding structure of the coil drive FPC on the display panel 000, That is, the display panel 000 may include the second bonding area BA2. The second bonding area BA2 may include the plurality of conductive pads 90. The coil drive FPC and the conductive pads 90 may be attached and electrically connected to each other. The conductive pads 90 may be electrically connected to the signal line 6 through the second via 82 in the display panel 000. In such way, the signal of the coil-containing film layer 30 may be connected to the second bonding area BA2 on the display panel 000 through the second via 82, and the coil drive FPC may be electrically connected to the second metal layer 303 of the coil-containing film layer 30 through the plurality of the conductive pads 90 in the second bonding area BA2. The electrical connection between the coil drive FPC and the signal line 6 of the second metal layer 303 may be implemented, and also the display effect in the display region AA may not be affected.

In some optional embodiments, referring to FIGS. 8-10. In one embodiment, the display component 0000 may further include a display drive FPC (not shown). The display drive FPC and the coil drive FPC may be integrated into one drive FPC.

In one embodiment, it may further illustrate that the display component 0000 may further include the display drive FPC, which may be used to supply the drive circuit and drive signal for implementing the display function of the display panel 000. In order to reduce the occupied non-display region NA and increase the display region AA, the display drive FPC and the coil drive FPC may be integrated into one drive FPC, which may be advantageous to implement the narrow-framed design of the display panel.

In some optional embodiments, referring to FIGS. 1-10, the display panel 000 may be a non-transmissive display panel.

In one embodiment, it may further illustrate that the structure of the coil-containing film layer 300 in the above-mentioned embodiments may be applied to the display panel 000 being the non-transmissive display panel. In the non-transmissive display panel, light may not pass through the coil-containing film layer 30, so the disposition of the winding coils in the first metal layer 301 and the second metal layer 303 may not affect the display function of the display panel 000. In such way, the wireless transmission of multiple functions may be integrated on one display panel, which may be advantageous to reduce cost and improve integration and may further develop the devices to be light-weight and integrated. In addition, the display quality of the display panel 000 may not be affected.

Optionally, the non-transmissive display panel may be an organic light-emitting display panel, an electronic paper display panel or a reflective liquid crystal display panel. In one embodiment, the types of the non-transmissive display panel may be merely exemplary for description, and may be other display panels, which may not be limited according to various embodiments in the present disclosure. The display panel 000 may be merely required to be the non-transmissive display panel and the light may not need to pass through the coil-containing film layer 30, which may not be described in detail in one embodiment.

Figure 11:
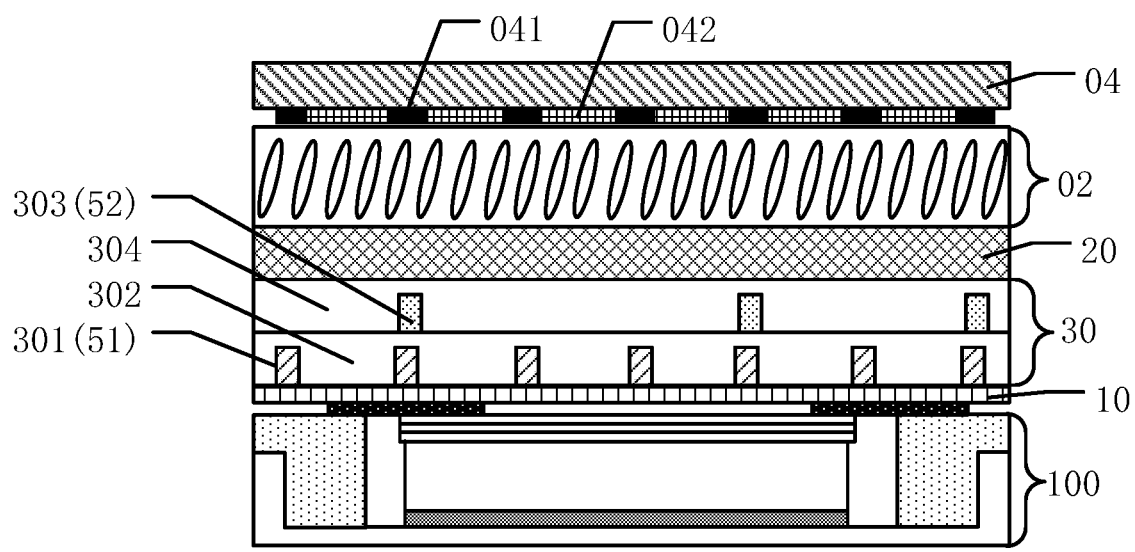
FIG. 11 illustrates a local cross-sectional structural schematic of an exemplary display panel according to embodiments of the present disclosure.
Figure 12:
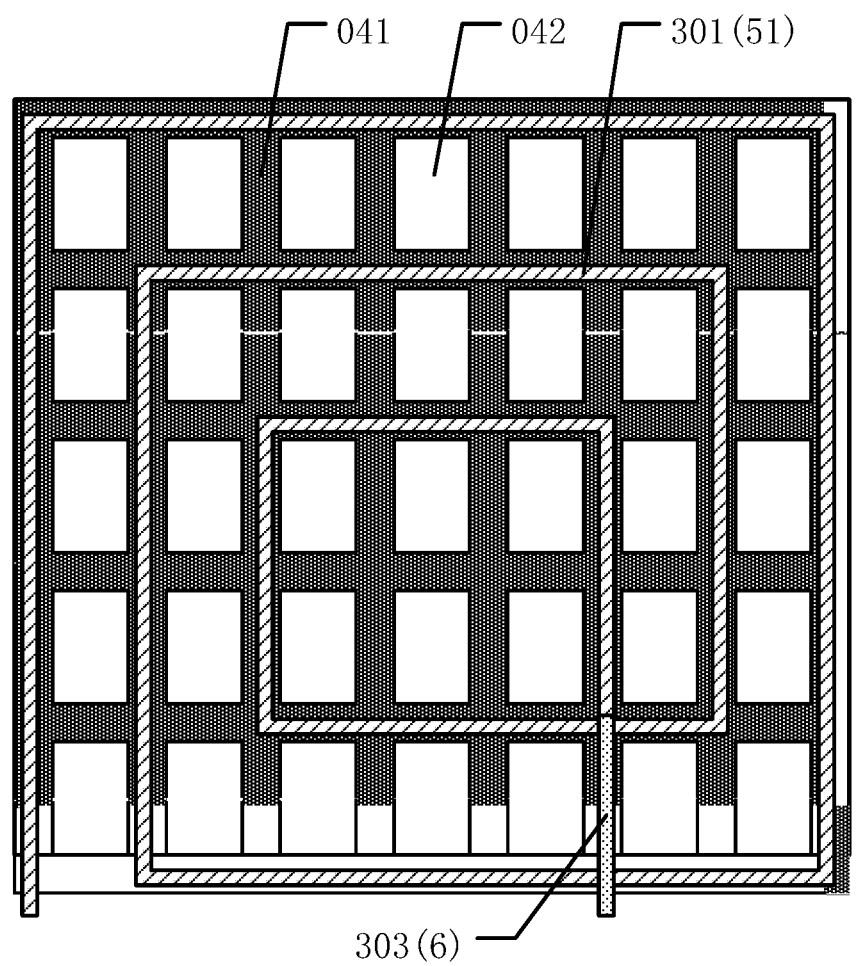
FIG. 12 illustrates a top-view schematic of an exemplary display panel in FIG. 11.

In some optional embodiments, referring to FIG. 11 and FIG. 12, FIG. 11 illustrates a local cross-sectional structural schematic of an exemplary display panel according to embodiments of the present disclosure; and FIG. 12 illustrates a top-view schematic of an exemplary display panel in FIG. 11. In one embodiment, the display panel 000 may be a transmissive display panel.

The transmissive display panel may include a backlight module 100 on the side of the coil-containing film layer 30, the first substrate 10 on a side of the backlight module 100 away from the coil-containing film layer 30, a liquid crystal layer 02 on the side of the first substrate 10 away from the coil-containing film layer 30, and a color film substrate 04 on a side of the liquid crystal layer 02 away from the coil-containing film layer 30.

The color film substrate 04 may include a black matrix 041 and a plurality of color resists 042 arranged in an array. The orthographic projection of the first coil 51 and the signal line 6 on the first substrate 10 may be within a range of the orthographic projection of the black matrix 041 on the first substrate 10.

In one embodiment, it may further illustrate that the structure of the coil-containing film layer 30 in the above-mentioned embodiments may further be applied to the display panel 000 being the transmissive display panel. Optionally, as shown in FIG. 11, the display panel may be the transmissive liquid crystal display panel including the backlight module 100 on the side of the coil-containing film layer 30, the first substrate 10 on the side of the backlight module 100 away from the coil-containing film layer 30, the liquid crystal layer 02 on the side of the first substrate 10 away from the coil-containing film layer 30, and the color film substrate 04 on the side of the liquid crystal layer 02 away from the coil-containing film layer 30. The color film substrate 04 may include the black matrix 041 and the plurality of color resists 042 arranged in an array. The image-displaying principle of the transmissive liquid crystal display panel may be described as the following. The liquid crystal layer 02 may be driven by an electric field to cause a twisted nematic electric field effect of liquid crystal molecules, which may control the light transmission or shielding of the backlight module. In addition to the function of the color film substrate 04, the display panel may display color images. Therefore, the display panel having a better transmittance may be required for the transmissive liquid crystal display panel to ensure better display quality. For the transmissive display panel, light may need to be projected from the backlight module 100 to a light-emitting surface of the display panel and then pass through the coil-containing film layer 30, but the first metal layer 301 and the second metal layer 303 of the coil-containing film layer 30 may be non-transmissive metal materials. In order to prevent the disposition of the coil-containing film layer 300 from affecting the transmittance of the display panel, the orthographic projection of the first coil 51 and the signal line 6 of the coil-containing film layer 30 on the first substrate 10 may be further disposed within the range of the orthographic projection of the black matrix 041 on the first substrate 10. In such way, the plurality of the first coils 51 integrating multiple functions of the wireless transmission may be designed in the coil-containing film layer 30, which may be advantageous to reduce cost, improve integration, further develop the devices to be light-weight and integrated, and may also avoid affecting the transmittance of the display panel and further affecting the display quality.

Figure 13:
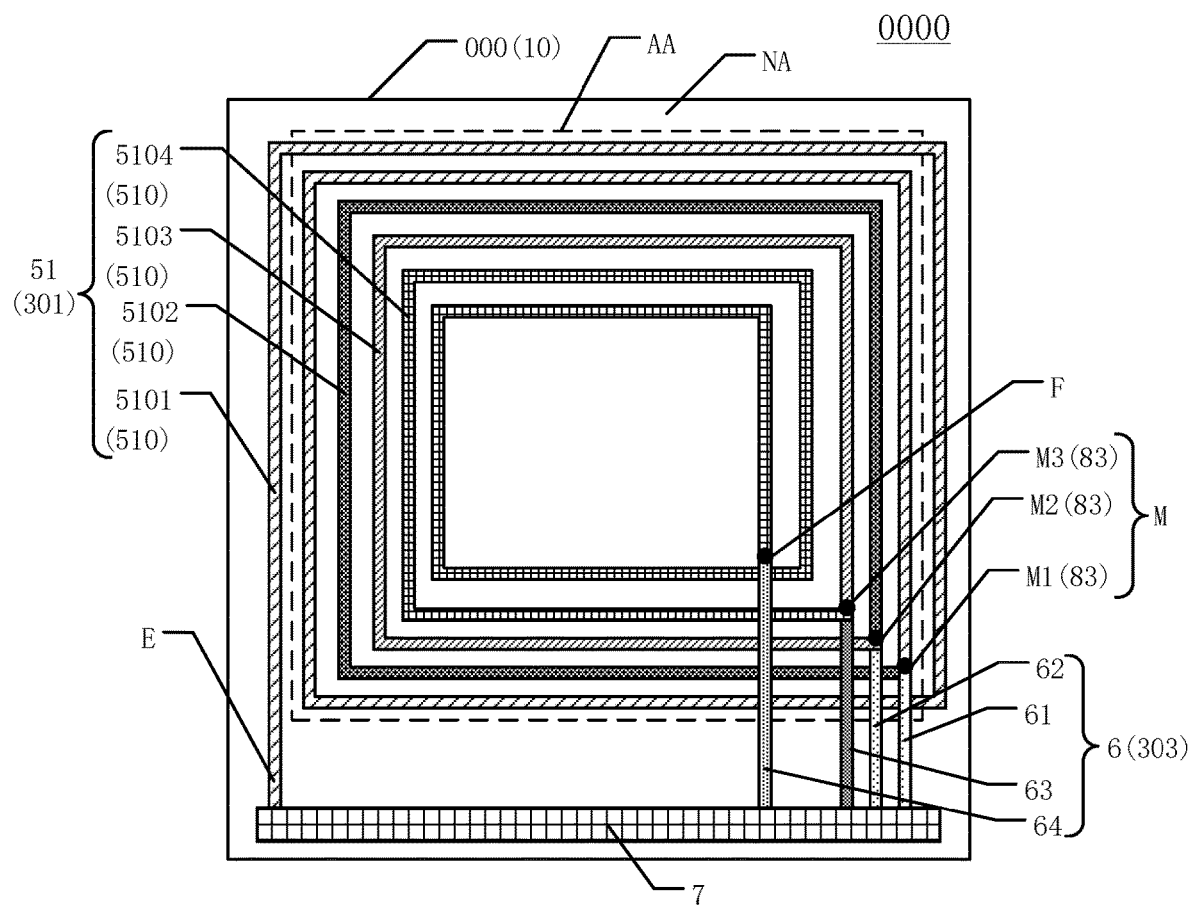
FIG. 13 illustrates a top-view schematic of another exemplary display component according to embodiments of the present disclosure.

In some optional embodiments, referring to FIG. 13, FIG. 13 illustrates a top-view schematic of another exemplary display component according to embodiments of the present disclosure. In one embodiment, a plurality of nodes M may be disposed on one first coil 51, and the plurality of nodes M may divide the first coil 51 into a plurality of the sub-coils 510. Each sub-coil 510 may be electrically connected to a different signal line 6 of the second metal layer 303 through a third via 83 at a node M position.

The coil-containing film layer 30 of the display component 000 provided in one embodiment may be disposed with only one first coil 51. The winding range of the first coil 51 may include entire or a portion of the non-display region NA and the display region AA, so the first coil 51 may have a large number of winding turns and also a large winding range. In order to implement wireless transmission compatible with multiple functions through one first coil 51, the plurality of nodes M may be further disposed on the one first coil 51 in one embodiment. The plurality of nodes M may divide the first coil 51 into the plurality of sub-coils 510. Each sub-coil 510 may be electrically connected to a different signal line 6 of the second metal layer 303 through the third via 83 at the node M. As shown in FIG. 13, it is assumed that three nodes, which are a node M1, a node M2, a node M3 respectively, may be respectively disposed on the one first coil 51. The sub-coil between an end E of the outermost turn of the first coil 51 and the node M1 is a first sub-coil 5101, which may be electrically connected to a first signal line 61 of the second metal layer 303 through the third via 83 at the node M1. The sub-coil between the node M1 and the node M2 is a second sub-coil 5102, which may be electrically connected to a second signal line 62 of the second metal layer 303 through the third via 83 at the node M2. The sub-coil between the node M2 and the node M3 is a third sub-coil 5103, which may be electrically connected a third signal line 63 of the second metal layer 303 through the third via 83 at the node M3. The sub-coil between the node M3 and an end F of the innermost turn of the first coil 51 is a fourth sub-coil 5104, which may be electrically connected to a fourth signal line 64 of the second metal layer 303 through the third via 83 at the end F of the innermost turn of the first coil 51. In such way, the three nodes M may divide the first coil 51 into four sub-coils 510.

For example, in one embodiment, different signal lines 6 may be drawn at the plurality of nodes M (the node M1, the node M2 and the node M3) on the first coil 51 and at the end F of the innermost turn of the first coil 51, and different signal lines 6 may be selected to supply alternating currents according to requirements. For example, when only the first signal line 61 have a supplied signal, and the second signal line 62, the third signal line 63 and the fourth signal line 64 do not have supplied signals, the first sub-coil 5101 may be connected to an effective circuit, that is, the number of transmitting coils corresponding to the first signal line 61 may be the number of the winding turns of the first sub-coil 5101. When only the second signal line 62 have a supplied signal, and the first signal line 61, the third signal line 63 and the fourth signal line 64 do not have supplied signals, the first sub-coil 5101 and the second sub-coil 5102 may be connected to an effective circuit, that is, the number of transmitting coils corresponding to the second signal line 62 may be a sum of the numbers of the winding turns of the first sub-coil 5101 and the second sub-coil 5102. When only the third signal line 63 have a supplied signal, and the first signal line 61, the second signal line 62 and the fourth signal line 64 do not have supplied signals, the first sub-coil 5101, the second sub-coil 5102 and the third sub-coil 5103 may be connected to an effective circuit, that is, the number of the transmitting coils corresponding to the third signal line 63 may be a sum of the numbers of the winding turns of the first sub-coil 5101, the second sub-coil 5102 and the third sub-coil 5103. When only the fourth signal line 64 have a supplied signal, and the first signal line 61, the second signal line 62 and the third signal line 63 do not have supplied signals, the first sub-coil 5101, the second sub-coil 5102, the third sub-coil 5103 and the fourth sub-coil 5104 may be connected to an effective circuit, that is, the entire first coil 51 may be connected to an effective circuit. The number of the transmitting coils corresponding to the fourth signal line 64 may be a sum of the numbers of the winding turns of the first sub-coil 5101, the second sub-coil 5102, the third sub-coil 5103 and the fourth sub-coil 5104, that is, a total number of the winding turns of the entire first coil 51. Therefore, different signal lines 6 may be selected to supply alternating currents according to different requirements. The number of the winding turns corresponding to each signal line may be different, so the corresponding inductance, natural frequency, and communication resonant frequency may also be different. Furthermore, one first coil 51 may be used to be compatible with a plurality of antennas and achieve the wireless transmission of multiple functions.

It should be noted that, in one embodiment, the arrangement method that the first coil 51 may be disposed with the plurality of nodes M, and the plurality of the nodes M may divide the first coil 51 into the plurality of sub-coils 510 may be merely exemplary for description. The number of winding turns of the plurality of the sub-coils 510 and the positions of the nodes M may also be exemplary for description, which may be selected according to actual requirements in implementation. In order to understand the technical solution of the one embodiment, different filling patterns may be used to distinguish each sub-coil 510 in FIG. 13.

In some optional embodiments, referring to FIG. 13, the number of the winding turns of one first coil 51 may be an integral multiple of the number of the winding turns of one sub-coil 510.

As defined, the number of the winding turns of one first coil 51 may be an integral multiple of the number of the winding turns of one sub-coil 510, such that the number of the winding turns of each sub-coil 510 may have at least one turn. When the number of the winding turns of one of the sub-coils 510 has at least one turn, the inductance of the sub-coil 510 may be increased to improve the signal strength as compared with a half turn or a non-full turn.

Figure 14:
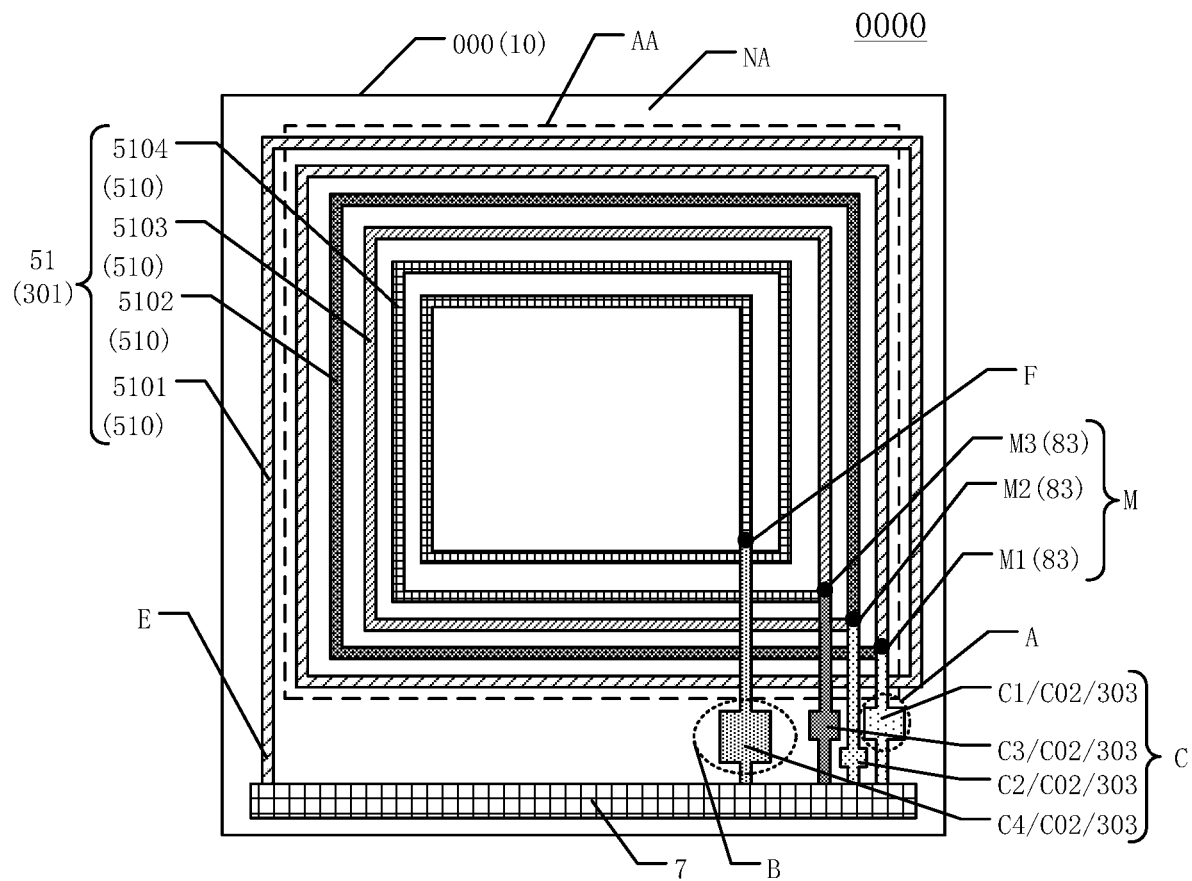
FIG. 14 illustrates a top-view schematic of another exemplary display component according to embodiments of the present disclosure.
Figure 15:
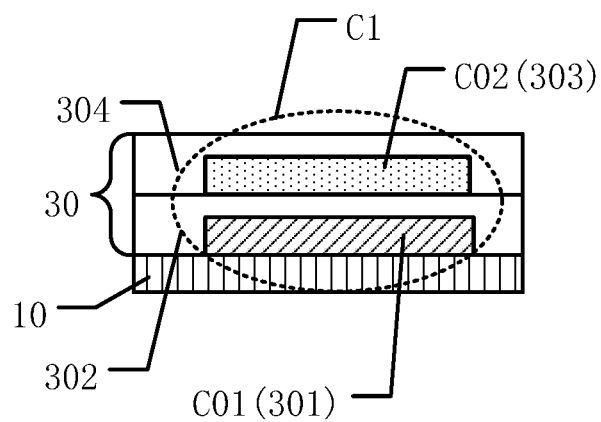
FIG. 15 illustrates a cross-sectional structural schematic at location A in FIG. 14.
Figure 16:
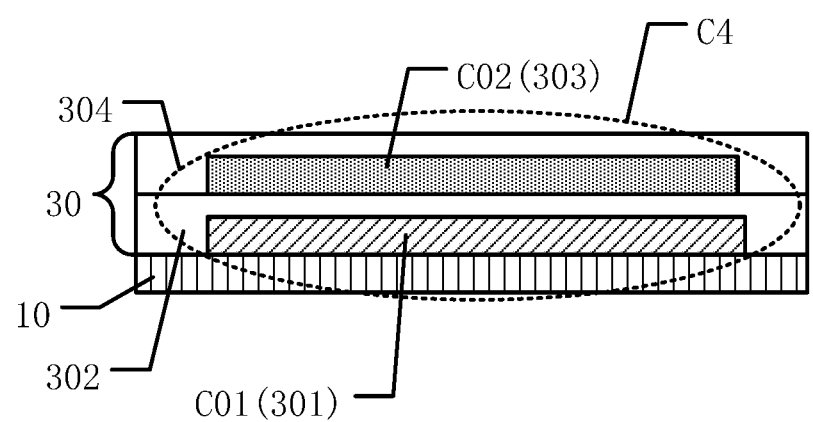
FIG. 16 illustrates a cross-sectional structural schematic at location B in FIG. 14.

In some optional embodiments, referring to FIGS. 14-16, FIG. 14 illustrates a top-view schematic of another exemplary display component according to embodiments of the present disclosure. FIG. 15 illustrates a cross-sectional structural schematic at location A in FIG. 14. FIG. 16 illustrates a cross-sectional structural schematic at location B in FIG. 14. In one embodiment, each sub-coil 510 may be connected to a capacitor C, which may be in the non-display region NA. The capacitor C may include a first electrode C01 and a second electrode C02 overlapping with the first electrode C01. The first electrode C01 may be in the first metal layer 301 and the second electrode C02 may be in the second metal layer 303.

In one embodiment, it may further illustrate that each sub-coil 510 may be connected to one capacitor C. In order not to occupy the space of the display region AA, the capacitor C may be disposed in the non-display region NA. Since another determining factor of the circuit's natural frequency is capacitance, each sub-coil 510 may be connected to a different capacitor C. Optionally, one electrode of the capacitor may be connected to an electromagnetic coil signal and another electrode of the capacitor may be grounded. A capacitance of the capacitor C connected to a different sub-coil 510 may be modified by adjusting the overlapping area between the first electrode C01 of the first metal layer 301 and the second electrode C02 of the second metal layer 303 in the capacitor C. As shown in FIGS. 14-16, the first sub-coil 5101 may be connected to a first capacitor C1; the second sub-coil 5102 may be connected to a second capacitor C2; the third sub-coil 5103 may be connected to a third capacitor C3; and the fourth sub-coil 5104 may be connected to a fourth capacitor C4. The capacitance of any two capacitors such as the first capacitor C1 and the second capacitor C2 may be modified by adjusting the overlapping area of each capacitor between the first electrode C01 and the second electrode C02. In such way, each different sub-coil 510 in the circuit may have a different natural frequency, and one first coil 51 may be used to be compatible with multiple antennas, thereby implementing the wireless transmission with multiple functions.

Figure 17:
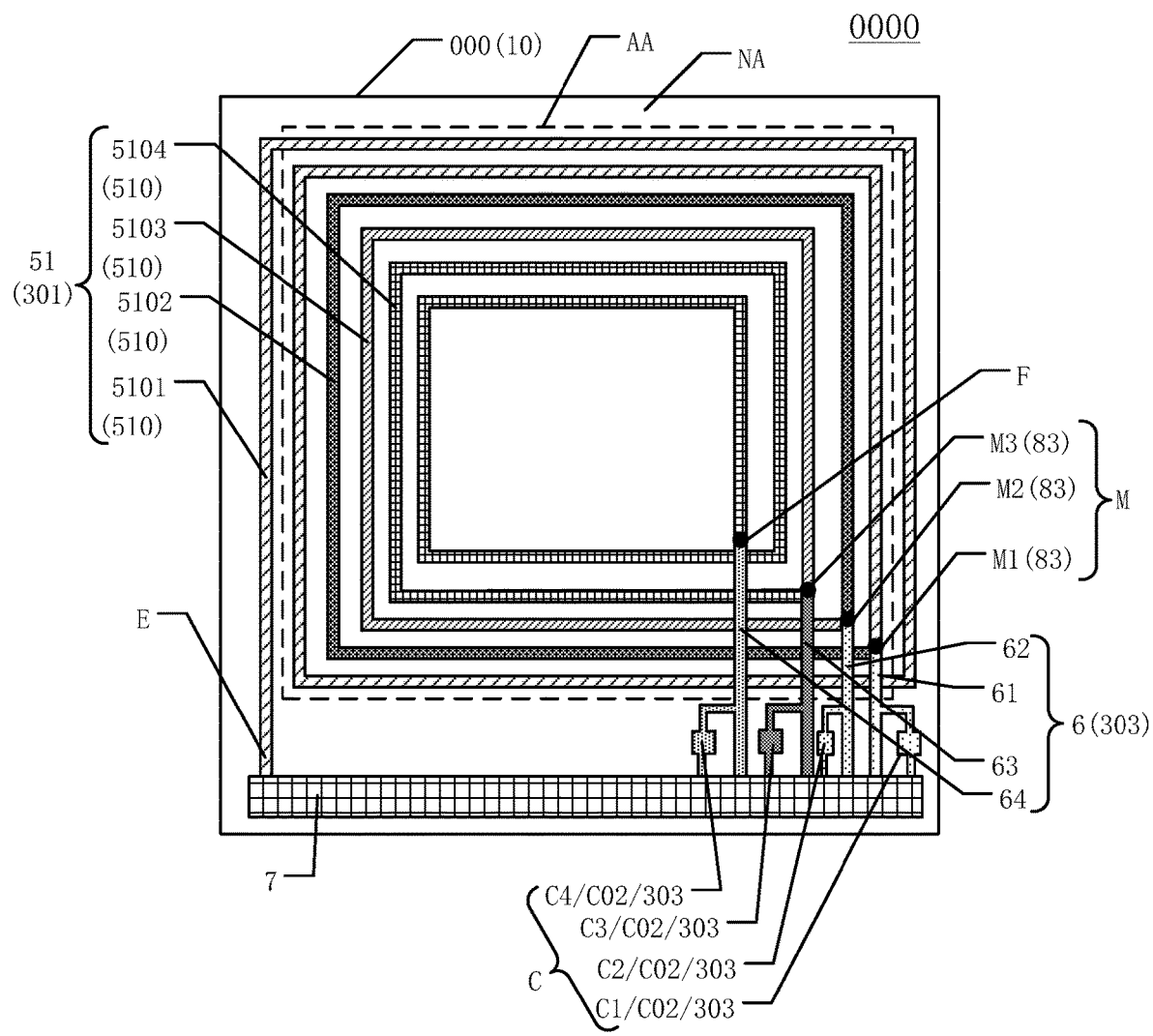
FIG. 17 illustrates a top-view schematic of another exemplary display component according to embodiments of the present disclosure.

It should be noted that, in above-mentioned embodiments, the effect of being compatible with multiple antennas may be implemented using one first coil 51, and different signal lines 6 may be selected to supply alternating currents simultaneously. Each signal line 6 may correspond to a different number of winding turns of a coil, and the capacitance of the capacitor C connected to each sub-coil 510 may be different. In such way, the natural frequency of each-coil 510 in the circuit may be adjusted to be different simultaneously (as shown in FIG. 17, FIG. 17 illustrates a top-view schematic of another exemplary display component according to embodiments of the present disclosure). Therefore, the wireless transmission with multiple functions may be implemented with more flexibility and selectivity, which may not be described in detail in one embodiment.

Figure 18:
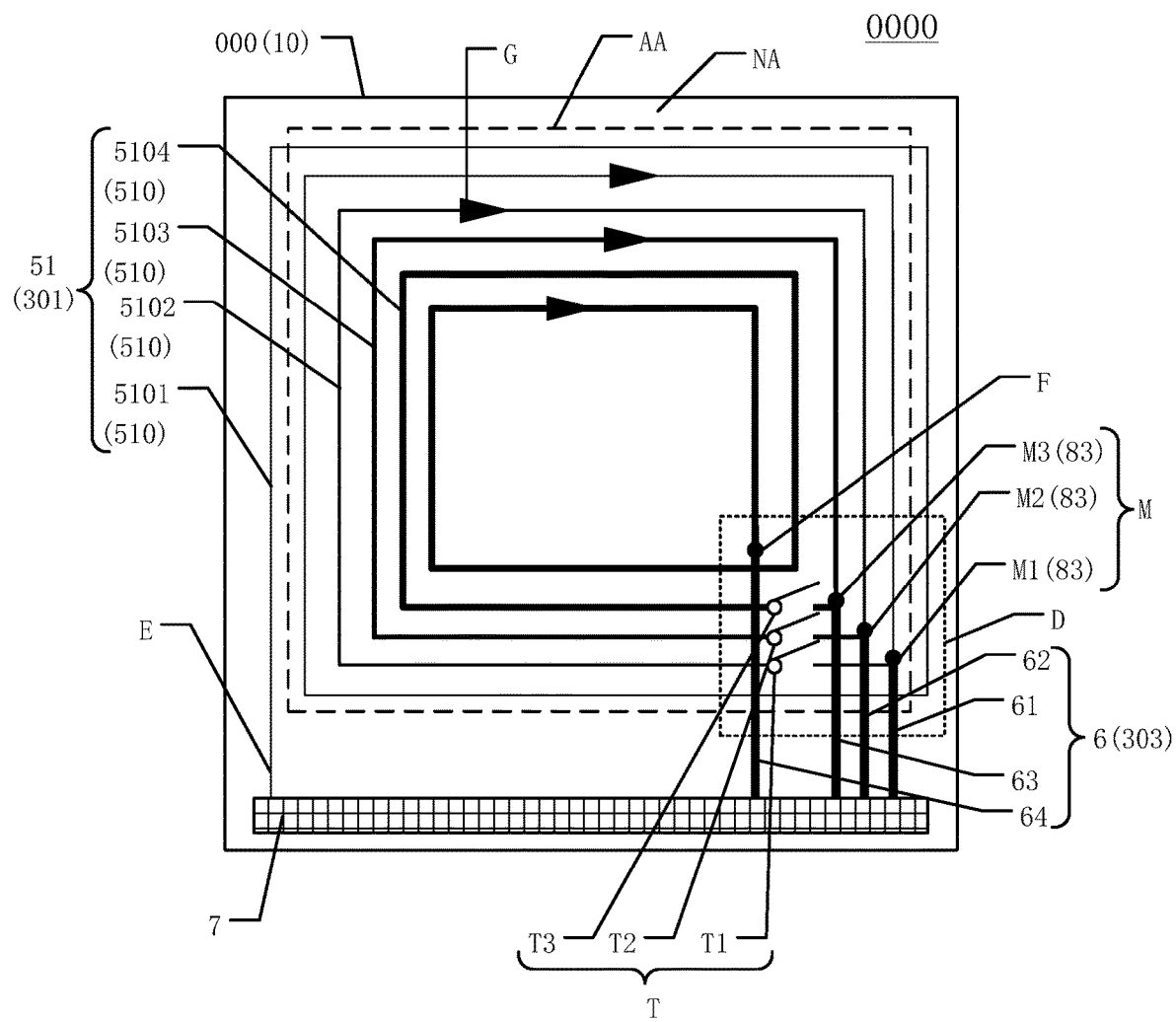
FIG. 18 illustrates an equivalent circuit diagram of a first coil of an exemplary display component according to embodiments of the present disclosure.
Figure 19:
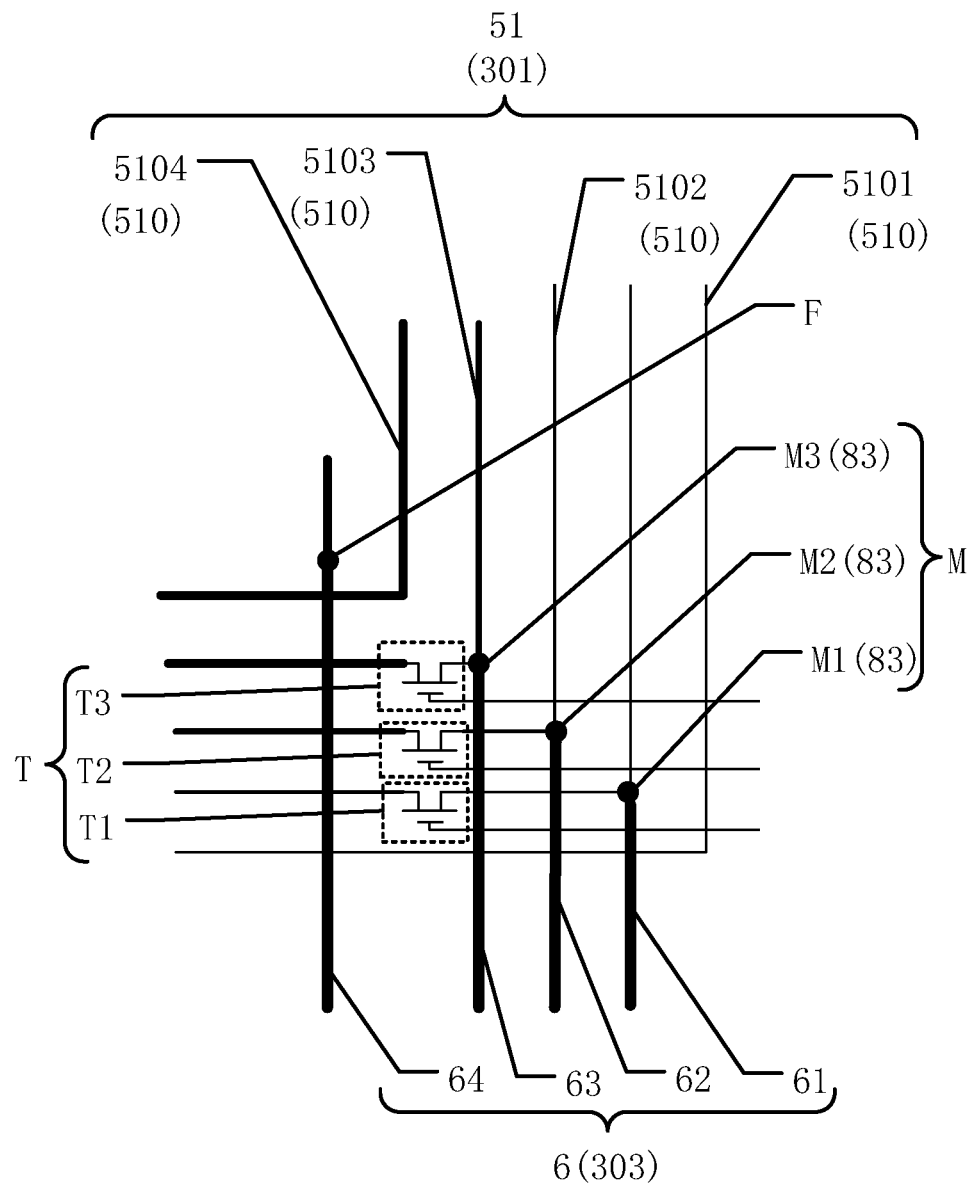
FIG. 19 illustrates a local enlarged view at location D in FIG. 18.

In some optional embodiments, referring to FIG. 18 and FIG. 19, FIG. 18 illustrates an equivalent circuit diagram of a first coil of an exemplary display component according to embodiments of the present disclosure (in order to clearly illustrate the technical solution in one embodiment, lines with different thicknesses may be used to distinguish each sub-coil 510 in FIG. 18). FIG. 19 illustrates a local enlarged view at location D in FIG. 18. In the display component provided in the one embodiment, a plurality of switch transistors T corresponding to the nodes M may be disposed on the first coil 51. The first coil 51 may include a signal input terminal (that is, corresponding to the end E of the outermost turn of the first coil 51) and a signal output terminal (that is, corresponding to the end F of the innermost turn of the first coil 51). A direction from the signal input terminal to the signal output terminal is a signal transmission direction G (an arrow direction G shown in FIG. 18). In the signal transmission direction G, each switch transistor T may be disposed after the node M corresponding to each switch transistor.

In one embodiment, it may further illustrate that the plurality of transistors T corresponding to the nodes M may be disposed on the first coil 51. Different signal lines 6 may be drawn at the plurality of nodes M (the node M1, the node M2 and the node M3) on the first coil 51 and at the end F of the innermost turn of the first coil 51, so different signal lines 6 may be selected to supply with alternating currents according to different requirements. When only one signal line 6 has a supplied signal and other signal lines 6 do not have supplied signals, the sub-coils 510 corresponding to the signal lines 6 without supplied signals may be dummy coils. In order to prevent the dummy coils from interfering with the electromagnetic induction of the entire first coil 51 (the interference may not be effectively eliminated by the coil drive circuit 7), the switch transistors T using as switches may be disposed at positions corresponding to the nodes M, and each switch transistor T may be disposed after the node M corresponding to each switch transistor in the signal transmission direction G.

For example, it is assumed that three nodes, which are respectively the node M1, the node M2, the node M3, may be respectively disposed on the one first coil 51. The sub-coil between the end E of the outermost turn of the first coil 51 and the node M1 is the first sub-coil 5101, which may be electrically connected to the first signal line 61 of the second metal layer 303 through the third via 83 at the node M1. The sub-coil between the node M1 and the node M2 is the second sub-coil 5102, which may be electrically connected to the second signal line 62 of the second metal layer 303 through the third via 83 at the node M2. The sub-coil between the node M2 and the node M3 is the third sub-coil 5103, which may be electrically connected the third signal line 63 of the second metal layer 303 through the third via 83 at the node M3. The sub-coil between the node M3 and the end F of the innermost turn of the first coil 51 is the fourth sub-coil 5104, which may be electrically connected to the fourth signal line 64 of the second metal layer 303 through the third via 83 at the end F of the innermost turn of the first coil 51. In such way, the three nodes M may divide the first coil 51 into four sub-coils 510.

When only the first signal line 61 has a supplied signal and the second signal line 62, the third signal line 63 and the fourth signal line 64 do not have supplied signals, the first sub-coil 5101 may be connected to the effective circuit, and the second sub-coil 5102, the third sub-coil 5103 and the fourth sub-coil 5104 may all be dummy coils. In order to completely disconnect the first sub-coil 5101 from signals of other sub-coils 510, a first switch transistor T1 may be disposed after the node M1 position (that is, a starting position of the second sub-coil 5102) along the signal transmission direction G, and the first switch transistor T1 may be switched off to electrically disconnect the other dummy coils from the first sub-coil 5101, thereby eliminating the interference of the other sub-coils 510 on the first sub-coil 5101.

When only the second signal line 62 has a supplied signal and the first signal line 61, the third signal line 63 and the fourth signal line 64 do not have supplied signals, the first sub-coil 5101 and the second sub-coil 5102 may be connected to the effective circuit, and the third sub-coil 5103 and the fourth sub-coil 5104 may all be dummy coils. In order to completely disconnect an effective coil formed by the first sub-coil 5101 and the second sub-coil 5102 from signals of other sub-coils 510, a second switch transistor T2 may be disposed after the node M2 position (that is, a starting position of the third sub-coil 5103) along the signal transmission direction G, and the second switch transistor T2 may be switched off. Currently, the first switch transistor T1 may be switched on, so the first sub-coil 5101 and the second sub-coil 5102 may be connected to form the effective coil and the other dummy coils may not be electrically connected to the second sub-coil 5102, thereby eliminating the interference of the other sub-coils 510 of the first coil 51 on the effective coil formed by the first sub-coil 5101 and the second sub-coil 5102.

When only the third signal line 63 has a supplied signal and the first signal line 61, the second signal line 62 and the fourth signal line 64 do not have supplied signals, the first sub-coil 5101, the second sub-coil 5102 and the third sub-coil 5103 may be connected to the effective circuit, and the fourth sub-coil 5104 may be the dummy coil. In order to completely disconnect an effective coil formed by the first sub-coil 5101, the second sub-coil 5102 and the third sub-coil 5103 from the signal of the fourth sub-coil 5104, a third switch transistor T3 may be disposed after the node M3 position (that is, a starting position of the fourth sub-coil 5104) along the signal transmission direction G, and the third switch transistor T3 may be switched off. Currently, the first switch transistor T1 may be switched on and the second switch transistor T2 may be switched on, so the first sub-coil 5101, the second sub-coil 5102 and third sub-coil 5103 may be connected to form an effective coil and the fourth sub-coil 5104 used as the dummy coil may not be electrically connected to the third sub-coil 5103, thereby eliminating the interference of the fourth sub-coil 5104 on the effective coil formed by the first sub-coil 5101, the second sub-coil 5102 and the third sub-coil 5103.

When only the fourth signal line 64 has a supplied signal and the first signal line 61, the second signal line 62 and the third signal line 63 do not have supplied signals, the first sub-coil 5101, the second sub-coil 5102, the third sub-coil 5103 and the fourth sub-coil 5104 may be connected to the effective circuit, that is, the entire first coil 51 may be an effective coil. Currently, the first switch transistor T1, the second switch transistor T2 and the third switch transistor T3 may all be switched on.

Figure 20:
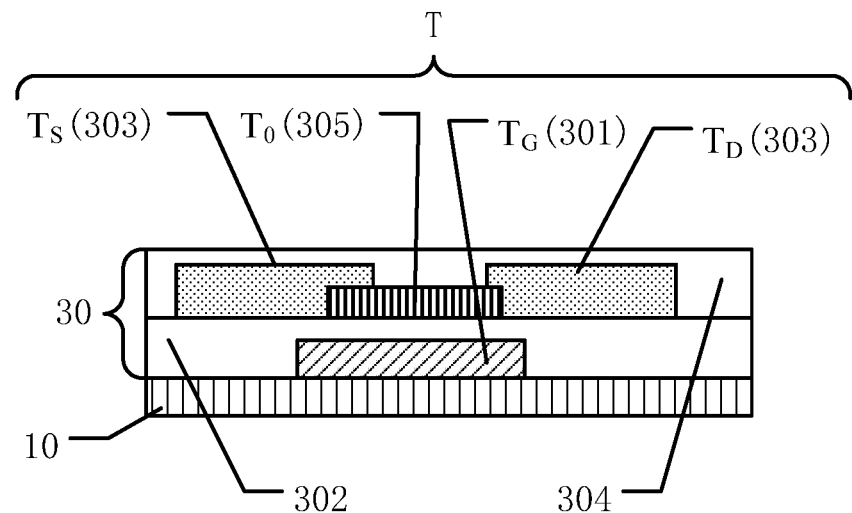
FIG. 20 illustrates a cross-sectional schematic at a switch transistor position in FIG. 19.
Figure 21:
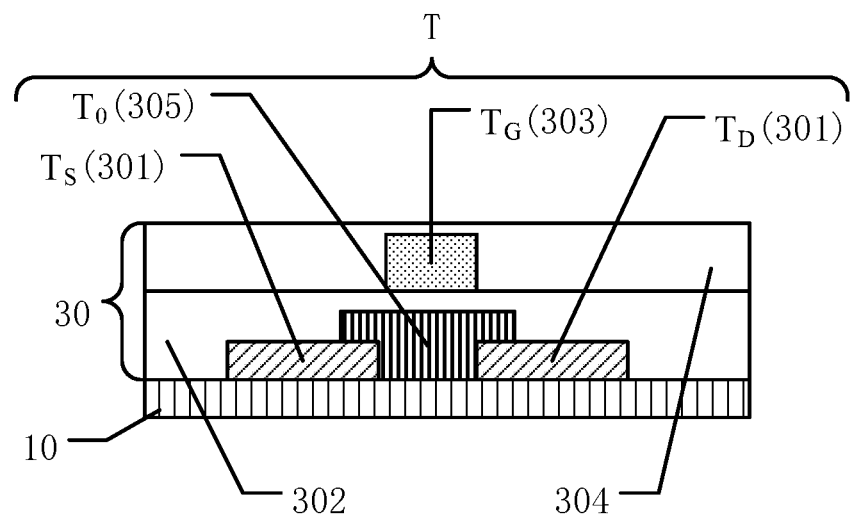
FIG. 21 illustrates another cross-sectional schematic of at a switch transistor position in FIG. 19.

In some optional embodiments, referring to FIG. 20 and FIG. 21, FIG. 20 illustrates a cross-sectional schematic at a switch transistor position in FIG. 19, and FIG. 21 illustrates another cross-sectional schematic at a switch transistor position in FIG. 19. In one embodiment, the switch transistor T may include a gate $T_G$, a source $T_S$, a drain $T_D$ and a silicon island $T_0$. A semiconductor layer 305 may be disposed between the first metal layer 301 and the second metal layer 303. The silicon island $T_O$ may be at the semiconductor layer 305.

The gate $T_G$ may be in the first metal layer 301, and the source $T_S$ and the drain $T_D$ may be in the second metal layer 303; or the gate $T_G$ may be in the second metal layer 303, and the source $T_S$ and the drain $T_D$ may be in the first metal layer 301.

In one embodiment, it may further illustrate that the switch transistor T may be fabricated in the film layer structure of the display component through the first metal layer 301 and the second metal layer 303 of the coil-containing film layer 30, and the semiconductor layer 305 between the first metal layer 301 and the second metal layer 303; and an additional film layer may not be needed, which may be advantageous to reduce process difficulty, simplify process and improve process efficiency. Optionally, for the switch transistor T, the gate $T_G$ may be in the first metal layer 301, and the source $T_S$ and the drain $T_D$ may be in the second metal layer 303 (shown in FIG. 20), where the switch transistor T may be a bottom gate structure. Optionally, for the switch transistor T, the gate $T_G$ may be in the second metal layer 303, and the source $T_S$ and the drain $T_D$ may be in the first metal layer 301 (shown in FIG. 21), where the switch transistor T may be top gate structure. The switch transistor T may be selected according to actual requirements.

In some optional embodiments, referring to FIG. 2, FIG. 4, and FIG. 7, each of the first insulation layer 302 and the second insulation layer 304 may be made of a material including polyimide.

In one embodiment, it may further define that each of the first insulation layer 302 and the second insulation layer 304 may be made of a material including polyimide. In the existing technology, the insulation layer may be made of silicon nitride. However, each of the first insulation layer 302 and the second insulation layer 304 may be made of a material including polyimide in one embodiment. Compared with silicon nitride, a deposition speed of polyimide may be faster in the manufacturing process, so a laying speed of the insulation layer may be high and the process efficiency may be improved, which may be advantageous to fabricate the coil-containing film layer 30 with a relatively large thickness. It may be advantageous to further fabricate narrower coil wires and save space to fabricate the first coils 51 with more numbers of winding turns, quantities and types.

Figure 22:
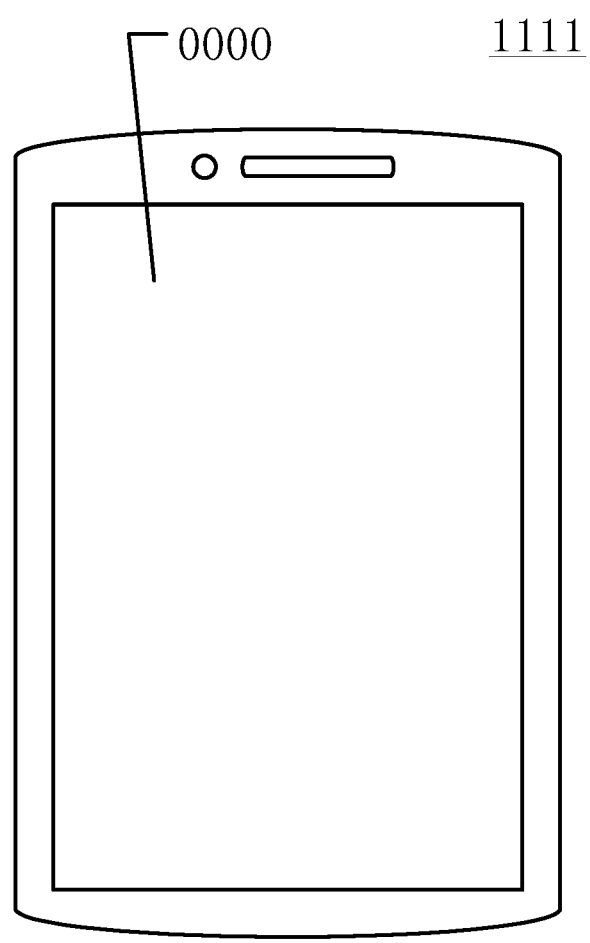
FIG. 22 illustrates a structural schematic of a display device according to embodiments of the present disclosure.

In some optional embodiments, referring to FIG. 22, FIG. 22 illustrates a structural schematic of a display device 1111 according to embodiments of the present disclosure. In one embodiment, the display device 1111 may include the display component 0000 provided by the above-mentioned embodiments of the present disclosure. The display device 1111 may be described using an exemplary mobile phone in FIG. 22. It can be understood that the display device 1111 provided by the embodiments of the present disclosure may be a display device having display functions, including a computer, a television, an in-vehicle display devices, etc., which may not be limited according to various embodiments of the present disclosure. The display device 1111 provided by the embodiments of the present disclosure may have beneficial effects of the display component 0000 provided by the embodiments of the present disclosure, which may refer to the detailed description of the display component 0000 in the above-mentioned embodiments and may not be described in detail.

From the above-mentioned embodiments, it can be seen that the display component and the display device provided by the present disclosure may achieve at least the following beneficial effects.

For the display component provided by the present disclosure, the coil-containing film layer may be disposed in the display panel, so the coil-containing film layer used for fabricating the wireless transmission function may be integrated between the thin-film transistor array layer and the first substrate, thereby implementing the integration of the display function and the wireless transmission function. The coil-containing film layer may at least include the first metal layer, the first insulation layer, the second metal layer, and the second insulation layer. The first insulation layer may be used to insulate the first metal layer and the second metal layer, and the second insulation layer may be used to insulate the second metal layer and other film layers, so the signal interference between the metal film layers may be avoided. Moreover, in the present disclosure, the first metal layer may include at least one first coil and the second metal layer may include at least one signal line, so the signal input and output function may be implemented between the first coil fabricated in the first metal layer and the coil drive circuit through the signal line of the second metal layer. The two metal layers including the first metal layer and the second metal layer may be disposed. In such way, in the electrical connection of one first coil and one signal line, the signal line of the second metal layer may be cross-line connected to the coil drive circuit to transmit drive signals over the first coil of the first metal layer. The present disclosure may further define that the orthographic projection of the first coil on the first substrate may be partially within the range of the display region. The display region may have a large area, so more than one, that is, the plurality of the first coils, may be disposed. Each first coil may be designed to have different coil widths, coil spacings, coil lengths, inner and outer coil diameters, coil shapes, numbers of winding turns, etc. according to the required circuit parameters, thereby obtaining the required coil inductance, capacitance and resistance for each coil. Therefore, the wireless transmission of multiple functions may be integrated on one display panel, which may be advantageous to reduce cost, improve integration, and further develop the devices to be light-weight and integrated.

The details of the present disclosure have been described through the embodiments provided above. However, those skilled in the art should understand that the disclosed embodiments are exemplary only and are not intended to limit the scope of the present disclosure. Those skilled in the art should understand that the disclosed embodiments can be modified according to the scope and principles of the present disclosure. The scope of the present disclosure is defined by the appended claims and their equivalents.

What is claimed is:

1. A display component, comprising:
a display panel, including a first substrate, a thin-film transistor array layer, a second substrate and a coil-containing film layer, wherein:
the coil-containing film layer is on a side of the first substrate, the thin-film transistor array layer is on a side of the coil-containing film layer away from the first substrate, and the second substrate is on a side of the thin-film transistor array layer away from the first substrate;
the coil-containing film layer at least includes a first metal layer, a first insulation layer, a second metal layer, and a second insulation layer, wherein the first metal layer is on the side of the first substrate adjacent to the second substrate, the first insulation layer is on a side of the first metal layer away from the first substrate, the second metal layer is on a side of the first insulation layer away from the first substrate, and the second insulation layer is on a side of the second metal layer away from the first substrate;

the first metal layer includes at least one first coil and the second metal layer includes at least one signal line, wherein one first coil of the first metal layer is electrically connected to one or two signal lines of the second metal layer; and the display panel includes a display region and a non-display region surrounding the display region, and an orthographic projection of the first coil on the first substrate is at least partially in the display region; and a coil drive circuit, wherein the coil drive circuit is electrically connected to each of the first coil and the signal line, respectively, wherein the second metal layer further includes at least one second coil, wherein the second coil has one end electrically connected to the first coil, and an other end electrically connected to the signal line; and an orthographic projection of the second coil on the first substrate is at least partially in the display region.

2. The display component according to claim 1, wherein: the first metal layer includes a plurality of first coils which have different winding lengths; the second metal layer includes a plurality of the signal lines, wherein a number of the first coils is same as a number of the signal lines, or the number of the signal lines is twice the number of the first coils.

3. The display component according to claim 1, wherein: the coil drive circuit at least includes one signal transmitting terminal and one signal receiving terminal, wherein the signal transmitting terminal is electrically connected to the one first coil of the first metal layer, and the signal receiving terminal is electrically connected to one signal line of the second metal layer.

4. The display component according to claim 1, wherein: the display panel is a non-transmissive display panel.

5. The display component according to claim 1, wherein: the display panel is a transmissive display panel.

6. The display component according to claim 1, wherein: a plurality of nodes is on the one first coil; the plurality of the nodes divides the first coil into a plurality of sub-coils; and each sub-coil is electrically connected to a different signal line of the second metal layer through a third via at a node position.

7. The display component according to claim 6, wherein: a number of winding turns of the one first coil is an integral multiple of a number of the winding turns of one sub-coil.

8. The display component according to claim 6, wherein: each sub-coil is connected to a capacitor in the non-display region;

the capacitor includes a first electrode and a second electrode overlapping with the first electrode; and the first electrode is in the first metal layer and the second electrode is in the second metal layer.

9. The display component according to claim 6, wherein: a plurality of switch transistors corresponding to the nodes is disposed on the first coil;

the first coil includes a signal input terminal and a signal output terminal, and a direction from the signal input terminal to the signal output terminal is a signal transmission direction; and each switch transistor is disposed after the node corresponding to each switch transistor along the signal transmission direction.

10. The display component according to claim 9, wherein: the switch transistor includes a gate, a source, a drain and a silicon island, wherein the silicon island is at a semiconductor layer disposed between the first metal layer and the second metal layer; and the gate is in the first metal layer, and the source and the drain are in the second metal layer; or the gate is in the second metal layer, and the source and the drain are in the first metal layer.

11. The display component according to claim 1, wherein: each of the first insulation layer and the second insulation layer is made of a material including polyimide.

12. A display component, comprising:

a display panel, including a first substrate, a thin-film transistor array layer, a second substrate and a coil-containing film layer, wherein:

the coil-containing film layer is on a side of the first substrate, the thin-film transistor array layer is on a side of the coil-containing film layer away from the first substrate, and the second substrate is on a side of the thin-film transistor array layer away from the first substrate;

the coil-containing film layer at least includes a first metal layer, a first insulation layer, a second metal layer, and a second insulation layer, wherein the first metal layer is on the side of the first substrate adjacent to the second substrate, the first insulation layer is on a side of the first metal layer away from the first substrate, the second metal layer is on a side of the first insulation layer away from the first substrate, and the second insulation layer is on a side of the second metal layer away from the first substrate;

the first metal layer includes at least one first coil and the second metal layer includes at least one signal line, wherein one first coil of the first metal layer is electrically connected to one or two signal lines of the second metal layer; and the display panel includes a display region and a non-display region surrounding the display region, and an orthographic projection of the first coil on the first substrate is at least partially in the display region;

a coil drive circuit, wherein the coil drive circuit is electrically connected to each of the first coil and the signal line, respectively; and a coil drive chip, wherein:

the coil drive circuit is integrated on the coil drive chip; and the coil drive chip is electrically connected to the first coil and the signal line through a coil drive flexible printed circuit, respectively.

13. The display component according to claim 12, wherein:

the display panel includes a first bonding area, wherein the thin-film transistor array layer at the first bonding area is hollowed out; and the coil drive flexible printed circuit and the signal line are attached and electrically connected to each other at the first bonding area.

14. The display component according to claim 12, wherein:
the display panel includes a second bonding area including a plurality of conductive pads; the coil drive flexible printed circuit and the conductive pads are attached and electrically connected to each other; and the conductive pads are electrically connected to the signal line through a second via in the display panel.

15. The display component according to claim 12, further comprising:
a display drive flexible printed circuit, wherein the display drive flexible printed circuit and the coil drive flexible printed circuit are integrated into one drive flexible printed circuit.

16. A display component, comprising:
a display panel, including a first substrate, a thin-film transistor array layer, a second substrate and a coil-containing film layer, wherein:
the coil-containing film layer is on a side of the first substrate, the thin-film transistor array layer is on a side of the coil-containing film layer away from the first substrate, and the second substrate is on a side of the thin-film transistor array layer away from the first substrate;
the coil-containing film layer at least includes a first metal layer, a first insulation layer, a second metal layer, and a second insulation layer, wherein the first metal layer is on the side of the first substrate adjacent to the second substrate, the first insulation layer is on a side of the first metal layer away from the first substrate, the second metal layer is on a side of the first insulation layer away from the first substrate, and the second insulation layer is on a side of the second metal layer away from the first substrate;
the first metal layer includes at least one first coil and the second metal layer includes at least one signal line, wherein one first coil of the first metal layer is electrically connected to one or two signal lines of the second metal layer; and
the display panel includes a display region and a non-display region surrounding the display region, and an orthographic projection of the first coil on the first substrate is at least partially in the display region; and
a coil drive circuit, wherein the coil drive circuit is electrically connected to each of the first coil and the signal line, respectively,
wherein the display panel is a transmissive display panel;
the display panel includes a backlight module on the side of the coil-containing film layer, the first substrate on a side of the backlight module away from the coil-containing film layer, a liquid crystal layer on the side of the first substrate away from the coil-containing film layer, and a color film substrate on a side of the liquid crystal layer away from the coil-containing film layer; and
the color film substrate includes a black matrix and a plurality of color resists arranged in an array; and an orthographic projection of the first coil and the signal line on the first substrate is within an orthographic projection of the black matrix on the first substrate.

\* \* \* \* \*